United States Patent
Ekstrom et al.

(10) Patent No.: US 9,847,194 B2
(45) Date of Patent: Dec. 19, 2017

(54) INTEGRATED ELECTRONIC SWITCH AND CONTROL MODULE FOR A POWER TOOL

(71) Applicant: Black & Decker Inc., Newark, DE (US)

(72) Inventors: Erik A. Ekstrom, Woodstock, MD (US); Matthew J. Velderman, Baltimore, MD (US); Redeat G. Alemu, Cockeysville, MD (US); Michael D. Grove, Windsor, PA (US); Alexandros T. Theos, Bel Air, MD (US); Alpay Hizal, Elkridge, MD (US)

(73) Assignee: Black & Decker Inc., New Britain, CT (US)

( * ) Notice: Subject to any disclaimer, the term of this patent is extended or adjusted under 35 U.S.C. 154(b) by 443 days.

(21) Appl. No.: 14/672,666

(22) Filed: Mar. 30, 2015

(65) Prior Publication Data
US 2015/0280517 A1    Oct. 1, 2015

Related U.S. Application Data

(60) Provisional application No. 61/971,865, filed on Mar. 28, 2014.

(51) Int. Cl.
*B25F 5/02* (2006.01)
*H01H 21/12* (2006.01)
(Continued)

(52) U.S. Cl.
CPC ............. *H01H 21/12* (2013.01); *B23Q 5/041* (2013.01); *B23Q 5/10* (2013.01); *B25B 21/02* (2013.01);
(Continued)

(58) Field of Classification Search
CPC ...... B25F 5/00; B25F 5/02; H01H 1/00; H01H 1/58; H01H 1/62; H01H 9/06;
(Continued)

(56) References Cited

U.S. PATENT DOCUMENTS

| 2,848,574 A | 8/1958 | Hutt et al. |
| 3,030,479 A | 4/1962 | Ehrlich et al. |

(Continued)

FOREIGN PATENT DOCUMENTS

| DE | 4038787 | 9/1993 |
| DE | 10161127 | 6/2002 |

(Continued)

OTHER PUBLICATIONS

EP Search, The Hague Report Oct. 20, 2015 Karl Dewaele.

*Primary Examiner* — Scott A. Smith
(74) *Attorney, Agent, or Firm* — Amir R. Rohani

(57) ABSTRACT

An electronic switch and control module for a power tool having an electric motor is provided. The module includes a module housing including a bottom surface, side walls, and an open face, a printed circuit board (PCB) received from the open face of the module housing and securely disposed within the module housing at a distance from the bottom surface of the module housing; power switches mounted on a top surface of the PCB, and heat sinks discretely arranged and each mounted over a respective one of the plurality of power switches and secured to the top surface of the PCB to transfer heat away from the power switch through the open face of the module housing. The module further includes an input unit having conductive tracks disposed on the PCB and an electro-mechanical element engaging the plurality of conductive tracks, the input unit generating a signal for controlling a switching operation of the plurality of power switches, and a controller mounted on the PCB configured (Continued)

to control the switching operation of the power switches based on the signal from the input unit.

15 Claims, 14 Drawing Sheets

(51) Int. Cl.

| | | |
|---|---|---|
| G05G 5/03 | (2008.04) | |
| B25F 5/00 | (2006.01) | |
| B23Q 5/04 | (2006.01) | |
| B23Q 5/10 | (2006.01) | |
| H01H 21/24 | (2006.01) | |
| H01H 9/06 | (2006.01) | |
| H05K 1/02 | (2006.01) | |
| B25B 21/02 | (2006.01) | |
| H02K 7/14 | (2006.01) | |
| H02K 9/06 | (2006.01) | |
| H02P 6/14 | (2016.01) | |
| H05K 1/18 | (2006.01) | |
| H05K 5/00 | (2006.01) | |
| H05K 1/11 | (2006.01) | |
| H01H 15/04 | (2006.01) | |
| H02K 11/33 | (2016.01) | |
| H05K 7/20 | (2006.01) | |

(52) U.S. Cl.
CPC ............... *B25F 5/00* (2013.01); *B25F 5/02* (2013.01); *G05G 5/03* (2013.01); *H01H 9/061* (2013.01); *H01H 21/24* (2013.01); *H02K 7/145* (2013.01); *H02K 9/06* (2013.01); *H02P 6/14* (2013.01); *H05K 1/021* (2013.01); *H05K 1/115* (2013.01); *H05K 1/181* (2013.01); *H05K 5/0026* (2013.01); *H05K 7/2039* (2013.01); *H05K 7/20136* (2013.01); *H01H 15/04* (2013.01); *H01H 2221/044* (2013.01); *H01H 2231/048* (2013.01); *H01H 2235/018* (2013.01); *H02K 11/33* (2016.01); *H05K 7/20854* (2013.01); *H05K 2201/10053* (2013.01); *H05K 2201/10151* (2013.01); *H05K 2201/10166* (2013.01)

(58) Field of Classification Search
CPC .......... H01H 9/061; H01H 9/063; H01H 9/52; H01H 15/04; H01H 15/102; H01H 21/12; H02K 7/145; H02K 9/06; H02K 11/33; H02K 11/215; H05K 1/021; H05K 1/182; H05K 7/20445; H05K 7/20854
USPC .............. 173/2, 117, 162.2, 169, 170, 217; 200/43.17, 243, 332.2, 341, 522, 553, 200/556, 559; 318/17, 249, 400.18, 434; 310/47, 50; 361/700, 704, 710, 760, 761
See application file for complete search history.

(56) References Cited

U.S. PATENT DOCUMENTS

| | | | |
|---|---|---|---|
| 3,283,105 | A | 11/1966 | Locke et al. |
| 3,484,632 | A | 12/1969 | Opalenik et al. |
| 3,543,120 | A | 11/1970 | Robertson |
| 3,562,462 | A | 2/1971 | Long |
| 3,590,194 | A | 6/1971 | Frenzel et al. |
| 3,594,521 | A | 7/1971 | Waskowsky et al. |
| 3,670,121 | A | 6/1972 | Howe |
| 3,674,966 | A | 7/1972 | Long |
| 3,676,627 | A | 7/1972 | Happe |
| 3,710,209 | A | 1/1973 | Webb et al. |
| 3,822,426 | A | 7/1974 | Mistarz et al. |
| 3,879,592 | A | 4/1975 | Comerford |
| 3,886,340 | A | 5/1975 | Bittel |
| 3,936,708 | A | 2/1976 | Dummer et al. |
| 3,961,146 | A | 6/1976 | Dummer et al. |
| 3,969,600 | A | 7/1976 | Sims et al. |
| 3,982,086 | A | 9/1976 | Marquardt et al. |
| 3,997,745 | A | 12/1976 | Marquardt et al. |
| 3,999,024 | A | 12/1976 | Marquardt et al. |
| 4,027,127 | A | 5/1977 | Dummer er al. |
| 4,035,596 | A | 7/1977 | Marquardt et al. |
| 4,045,650 | A | 8/1977 | Nestor et al. |
| 4,057,520 | A | 11/1977 | Schwartz et al. |
| 4,118,615 | A | 10/1978 | Leibundgut et al. |
| 4,133,993 | A | 1/1979 | Judd et al. |
| 4,179,644 | A | 12/1979 | Vassos et al. |
| 4,200,781 | A | 4/1980 | Dummer et al. |
| 4,205,434 | A | 6/1980 | Brozoski et al. |
| 4,241,297 | A | 12/1980 | Piber et al. |
| 4,241,298 | A | 12/1980 | Trammell et al. |
| 4,328,405 | A | 5/1982 | Cuneo et al. |
| 4,348,603 | A | 9/1982 | Huber et al. |
| 4,351,581 | A | 9/1982 | Wied et al. |
| 4,370,579 | A | 1/1983 | Kobayashi et al. |
| 4,506,198 | A | 3/1985 | Savas |
| 4,552,206 | A | 11/1985 | McCarthy et al. |
| 4,553,005 | A | 11/1985 | Glenn et al. |
| 4,572,997 | A | 2/1986 | Yamanobe et al. |
| 4,665,290 | A | 5/1987 | Piber et al. |
| 4,698,471 | A | 10/1987 | Piber et al. |
| 4,719,395 | A | 1/1988 | Aoi et al. |
| 4,737,661 | A | 4/1988 | Lessig, III et al. |
| 4,754,110 | A | 6/1988 | Craft et al. |
| 4,843,200 | A | 6/1989 | Parlatore et al. |
| 4,849,856 | A | 7/1989 | Reynolds et al. |
| 4,859,820 | A | 8/1989 | Gotfryd et al. |
| 4,934,494 | A | 6/1990 | Hayashi et al. |
| 4,937,705 | A | 6/1990 | Piber |
| 4,961,125 | A | 10/1990 | Clemens et al. |
| 5,047,837 | A | 9/1991 | Kitano et al. |
| 5,051,547 | A * | 9/1991 | Nagata .................. H01H 9/063 200/1 V |
| 5,075,604 | A * | 12/1991 | Crook .................... H01H 9/061 200/522 |
| 5,136,469 | A * | 8/1992 | Carusillo ........... A61B 17/1628 361/720 |
| 5,181,603 | A | 1/1993 | Mori et al. |
| 5,198,793 | A | 3/1993 | Leveque |
| 5,200,657 | A | 4/1993 | Prestel |
| 5,311,395 | A | 5/1994 | Zeik et al. |
| 5,331,785 | A | 7/1994 | Brak |
| 5,345,132 | A | 9/1994 | Sasaki et al. |
| 5,365,399 | A | 11/1994 | Glomski et al. |
| 5,366,027 | A | 11/1994 | Dryer et al. |
| 5,382,768 | A | 1/1995 | Kurek et al. |
| D357,227 | S | 4/1995 | Smithers |
| 5,486,669 | A | 1/1996 | Oshgan |
| 5,495,080 | A | 2/1996 | Periou et al. |
| 5,548,482 | A | 8/1996 | Hatauchi et al. |
| 5,554,965 | A | 9/1996 | Sundberg et al. |
| 5,796,058 | A | 8/1998 | Aimi et al. |
| 5,798,584 | A | 8/1998 | Schaeffeler et al. |
| 5,804,873 | A | 9/1998 | Pelly |
| 5,835,351 | A | 11/1998 | Ulanski et al. |
| 5,990,429 | A | 11/1999 | Kramer et al. |
| 6,097,603 | A | 8/2000 | Edwards et al. |
| 6,104,105 | A | 8/2000 | Schaeffeler et al. |
| 6,166,464 | A | 12/2000 | Grant et al. |
| 6,178,628 | B1 | 1/2001 | Mellinger et al. |
| 6,200,407 | B1 * | 3/2001 | Wieloch ................ H05K 1/021 156/252 |
| 6,262,380 | B1 | 7/2001 | Sasaki et al. |
| 6,278,199 | B1 | 8/2001 | Grant et al. |
| 6,281,482 | B1 | 8/2001 | Chu et al. |
| 6,483,063 | B2 | 11/2002 | Chu et al. |
| 6,525,285 | B2 | 2/2003 | Kudo et al. |
| 6,525,639 | B1 | 2/2003 | Cheng et al. |
| 6,552,904 | B2 | 4/2003 | Fung et al. |
| 6,555,773 | B1 * | 4/2003 | Broghammer ........... H01H 9/06 200/321 |
| 6,555,775 | B1 | 4/2003 | Van Bokhoven et al. |

(56) References Cited

U.S. PATENT DOCUMENTS

| | | |
|---|---|---|
| 6,580,045 B1 | 6/2003 | Kuo et al. |
| 6,707,676 B1 | 3/2004 | Geva et al. |
| 6,717,080 B1 | 4/2004 | Chan et al. |
| 6,736,220 B1 | 5/2004 | Chan et al. |
| 6,741,051 B2 | 5/2004 | Chu et al. |
| 6,749,028 B1 | 6/2004 | Chan et al. |
| 6,753,489 B2 | 6/2004 | Kiyono et al. |
| 6,759,608 B2 | 7/2004 | Chu et al. |
| 6,784,390 B2 | 8/2004 | Chu et al. |
| 6,794,594 B2 | 9/2004 | Ching et al. |
| 6,831,387 B2 | 12/2004 | Kondo et al. |
| 6,833,521 B2 | 12/2004 | Nishikawa et al. |
| 6,833,997 B1 | 12/2004 | Jones, III et al. |
| 6,861,607 B2 | 3/2005 | Kwong et al. |
| 6,919,523 B1 | 7/2005 | Lai et al. |
| 6,989,503 B2 | 1/2006 | Wong et al. |
| 7,012,207 B2 | 3/2006 | Yahagi et al. |
| 7,019,243 B2 | 3/2006 | Tsuda et al. |
| 7,112,751 B2 | 9/2006 | Turley et al. |
| 7,115,826 B2 | 10/2006 | Sasaki et al. |
| 7,121,893 B2 | 10/2006 | Broghammer et al. |
| 7,210,542 B2 | 5/2007 | Lam et al. |
| 7,211,758 B2 | 5/2007 | Lui et al. |
| 7,211,759 B2 | 5/2007 | Chou et al. |
| 7,239,039 B2 | 7/2007 | Kutlugil et al. |
| 7,282,880 B2 | 10/2007 | Glasgow et al. |
| 7,297,891 B2 * | 11/2007 | Omori .................... H01H 9/063 200/522 |
| 7,313,001 B2 | 12/2007 | Broghammer et al. |
| 7,323,797 B2 | 1/2008 | Furui et al. |
| 7,355,138 B2 | 4/2008 | Chou et al. |
| 7,359,628 B2 | 4/2008 | Broghammer et al. |
| 7,417,849 B2 | 8/2008 | Dixon et al. |
| 7,468,492 B2 | 12/2008 | Lai et al. |
| 7,476,821 B1 | 1/2009 | Knuppel et al. |
| 7,511,240 B2 | 3/2009 | Inagaki et al. |
| 7,557,321 B2 | 7/2009 | Arataki et al. |
| 7,584,817 B2 * | 9/2009 | Kim .................... H05K 7/20854 180/444 |
| 7,704,080 B2 | 4/2010 | Naumann et al. |
| 7,705,260 B2 | 4/2010 | Xu et al. |
| 7,746,650 B2 | 6/2010 | Neumann et al. |
| 7,754,989 B2 | 7/2010 | Wong et al. |
| 7,969,116 B2 | 6/2011 | Hanawa et al. |
| D648,280 S | 11/2011 | Zhang et al. |
| 8,071,903 B2 | 12/2011 | Sato et al. |
| 8,087,475 B2 | 1/2012 | Habel et al. |
| 8,089,019 B2 | 1/2012 | Inagaki et al. |
| 8,130,498 B2 | 3/2012 | Wirnitzer et al. |
| 8,188,395 B2 | 5/2012 | Steidle et al. |
| 8,254,125 B2 * | 8/2012 | Chen .................... H01L 23/36 173/217 |
| 8,300,403 B2 | 10/2012 | Chang et al. |
| 8,330,066 B2 | 12/2012 | Xu et al. |
| 8,410,387 B2 | 4/2013 | Niklewski et al. |
| 8,446,120 B2 * | 5/2013 | Forster .................... B25F 5/00 318/503 |
| 8,456,113 B2 | 6/2013 | Lexer et al. |
| 8,550,181 B2 | 10/2013 | Kobayashi et al. |
| 8,701,792 B2 * | 4/2014 | Doring .................... B25F 5/02 173/170 |
| 8,921,723 B2 * | 12/2014 | Yamanaka .................... B60R 22/48 200/61.59 |
| 8,951,071 B2 | 2/2015 | Hack et al. |
| 9,009,932 B2 | 4/2015 | Thorbole et al. |
| 9,060,616 B2 | 6/2015 | Cohen |
| 9,318,932 B2 * | 4/2016 | Purohit .................... H02K 9/06 |
| 2009/0245958 A1 | 10/2009 | Lau et al. |
| 2010/0253162 A1 | 10/2010 | Sakamaki et al. |
| 2010/0314147 A1 | 12/2010 | Müller et al. |
| 2011/0253402 A1 | 10/2011 | Aradachi et al. |
| 2012/0234657 A1 | 9/2012 | Nishikimi et al. |
| 2012/0292063 A1 | 11/2012 | Forster et al. |
| 2012/0292067 A1 | 11/2012 | Velderman et al. |
| 2012/0292068 A1 | 11/2012 | Velderman et al. |
| 2012/0293099 A1 | 11/2012 | Velderman et al. |
| 2013/0112540 A1 | 5/2013 | Chen et al. |
| 2013/0119792 A1 | 5/2013 | Nishimiya et al. |
| 2013/0140167 A1 | 6/2013 | Kobayashi |
| 2013/0193891 A1 | 8/2013 | Wood et al. |
| 2013/0206561 A1 | 8/2013 | Kong et al. |

FOREIGN PATENT DOCUMENTS

| | | |
|---|---|---|
| DE | 10212721 | 9/2002 |
| DE | 102004051653 | 4/2006 |
| DE | 102007031016 | 2/2009 |
| DE | 102009027317 | 1/2011 |
| DE | 102011008851 | 8/2011 |
| EP | 0812015 | 10/1997 |
| EP | 0962123 | 12/1999 |
| EP | 1586223 | 8/2006 |
| EP | 1113495 | 3/2007 |
| EP | 1374266 | 6/2007 |
| EP | 1858079 | 11/2007 |
| EP | 2100702 | 9/2009 |
| EP | 1621293 | 12/2010 |
| EP | 2395527 | 12/2011 |
| EP | 2524773 | 11/2012 |
| EP | 1728597 | 9/2013 |
| GB | 2314980 | 1/1998 |
| JP | 2002127047 | 5/2002 |
| WO | 9807303 | 2/1999 |
| WO | 2008083667 | 7/2008 |
| WO | 2014031539 | 2/2014 |

* cited by examiner

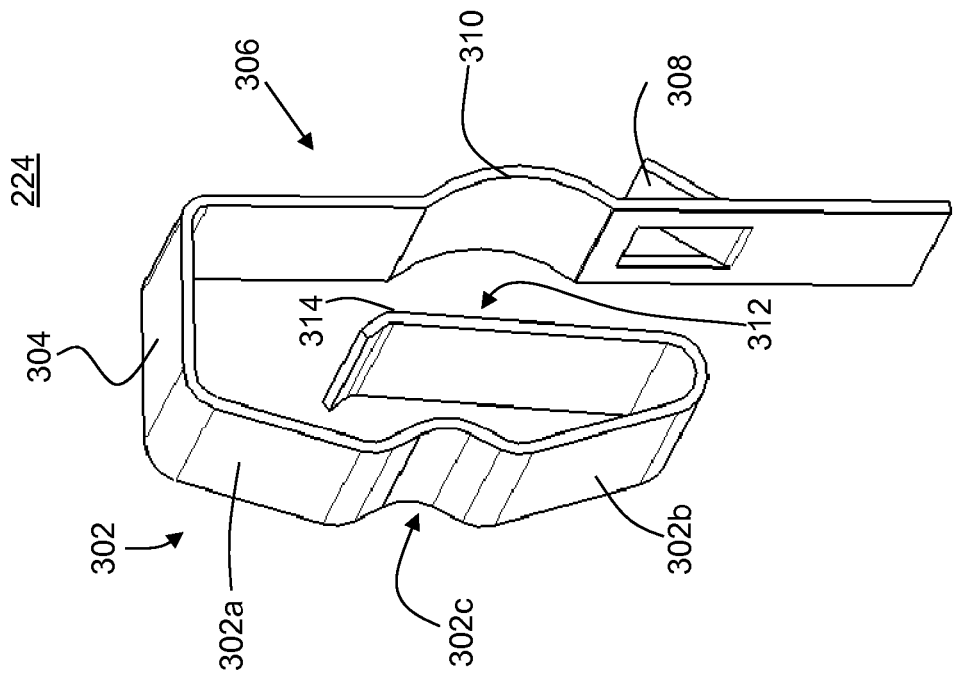
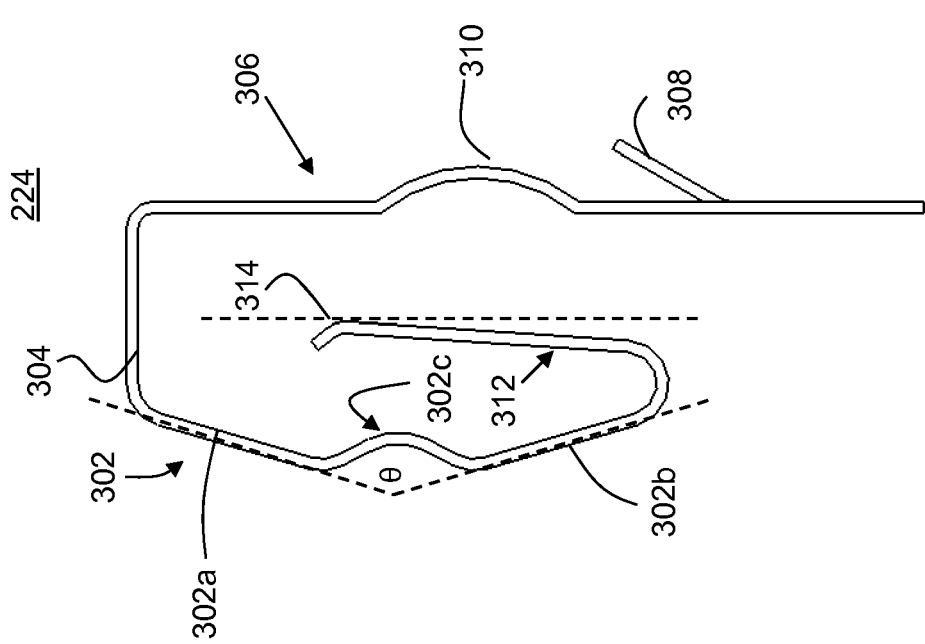

INTEGRATED ELECTRONIC SWITCH AND CONTROL MODULE FOR A POWER TOOL

CROSS-REFERENCE TO RELATED APPLICATION

This application claims the benefit of U.S. Provisional Application No. 61/971,865 titled "Electronic Switch Module For A Power Tool" filed Mar. 28, 2014, content of which is incorporated herein by reference in its entirety.

BACKGROUND

Use of cordless power tools has increased dramatically in recent years. Cordless power tools provide the ease of a power assisted tool with the convenience of cordless operation. Conventionally, cordless tools have been driven by Permanent Magnet (PM) brushed motors that receive DC power from a battery assembly or converted AC power. In a PM brushed motor, commutation is achieved mechanically via a commutator and a brush system. By contrast, in a brushless DC motor, commutation is achieved electronically by controlling the flow of current to the stator windings. A brushless DC motor includes a rotor for providing rotational energy and a stator for supplying a magnetic field that drives the rotor. Comprising the rotor is a shaft supported by a bearing set on each end and encircled by a permanent magnet (PM) that generates a magnetic field. The stator core mounts around the rotor maintaining an air-gap at all points except for the bearing set interface. Included in the air-gap are sets of stator windings that are typically connected in either a three-phase wye or Delta configuration. Each of the windings is oriented such that it lies parallel to the rotor shaft. Power devices such as MOSFETs are connected in series with each winding to enable power to be selectively applied. When power is applied to a winding, the resulting current in the winding generates a magnetic field that couples to the rotor. The magnetic field associated with the PM in the rotor assembly attempts to align itself with the stator generated magnetic field resulting in rotational movement of the rotor. A control circuit sequentially activates the individual stator coils so that the PM attached to the rotor continuously chases the advancing magnetic field generated by the stator windings. A set of sense magnets coupled to the PMs in the rotor assembly are sensed by a sensor, such as a Hall Effect sensor, to identify the current position of the rotor assembly. Proper timing of the commutation sequence is maintained by monitoring sensors mounted on the rotor shaft or detecting magnetic field peaks or nulls associated with the PM.

Conventionally, power switches are provided within the power tool in close proximity to the motor or within the handle. Electronics including a controller for controlling the power devices are also provided within the handle or in the vicinity of the motor. A trigger switch assembly is also provided, preferable on the handle where it is easy for the user to engage. The controller is coupled to both the trigger assembly and the power devices and regulates the flow of power through the power devices based on the input from the trigger assembly. All the connectivity between these modules requires substantial wiring. Also, since the power devices generate a considerable amount of heat, they should be arranged within the power tool to transfer heat away from the power devices effectively.

SUMMARY

According to an aspect of the invention, an electronic switch and control module is provided for a power tool having an electric motor, comprising: a module housing including a bottom surface, side walls, and an open face; a printed circuit board (PCB) fittingly received from the open face of the module housing and securely disposed within the module housing; an encapsulation member arranged to mate with a mating surface of the side walls of the module housing to form an enclosed compartment over a portion of the PCB to enclose at least one electronic or electro-mechanical element mounted on a surface of the PCB; and a plurality of power switches mounted on the surface of the PCB within an open compartment of the module housing where the encapsulation member does not enclose the surface of the PCB, the power switches being electrically configured to switchably connect a supply of electric power from a power source to the electric motor.

In an embodiment, the electronic switch and control module further includes a controller mounted on the PCB and coupled to the input unit and the power switches, and the controller is configured to control the switching operation of the power switches based the signal from the input unit.

In an embodiment, the electronic switch and control module further includes a heat sink arranged to transfer heat away from the power switches.

In an embodiment, the electronic switch and control module further includes a plurality of heat sinks discretely mounted over a respective one of the plurality of power switches and secured to the surface of the PCB to transfer heat away from the power switches.

In an embodiment, the electronic switch and control module further includes an input unit having at least one electro-mechanical element at least partially disposed within the enclosed component and generating a signal for controlling a switching operation of the plurality of power switches.

In a further embodiment, the electro-mechanical element of the input unit includes a speed-sensing member on the surface of the PCB and a variable-speed actuator having a sliding member in sliding contact with the speed-sensing member, where the speed-sensing member and the sliding member are disposed and substantially enclosed within the enclosed compartment, and the speed-sensing member generates the signal for controlling a switching operation of the plurality of power switches based on a sliding position of the sliding member. In an embodiment, the variable-speed actuator further includes a variable-speed trigger disposed outside the module housing and a link slidably extending from the variable-speed through an aperture in the module housing into the enclosed compartment and coupled to the sliding member.

In an further or alternative embodiment, the electro-mechanical element of the input unit includes a contact-sensing member on the surface of the PCB and a forward/reverse actuator having a contact member in selective contact with the contact-sensing member, where the contact-sensing member and the contact member are disposed and substantially enclosed within the enclosed compartment, and the contact-sensing member generates the signal for controlling a rotational direction of the motor. In an embodiment, the forward/reverse actuator further includes a pivot member supported by the module housing and an engagement member extending outside the module housing from the pivot member, the pivot member pivotably linking the contact member and the engagement member.

In an embodiment, the encapsulation member includes a wall arranged to rest on the surface of the PCB, and a lower end of the wall is sealed to the surface of the PCB.

In an embodiment, the encapsulation member includes at least one of wire retention or wire guide features arranged to retain or guide wires coupled to the PCB.

In an embodiment, the electronic switch and control module further includes a conformal coating applied on the surface of the PCB associated with the open compartment but not on at least a part of the surface of the PCB associated with the enclosed compartment. In a further embodiment, the encapsulation member includes a wall arranged to rest on the surface of the PCB, and a lower end of the wall is sealed to the surface of the PCB via the conformal coating.

In an embodiment, the encapsulation member and the module housing include mating features for securely mounting the encapsulation member on the module housing. In a further embodiment, the mating features include a tongue provided on one of the encapsulation member or the module housing and a corresponding groove provided on the other of the encapsulation member or the module housing to form a seal between the encapsulation member and the module housing.

In an embodiment, an electric power tool is provided having an electric motor and an electronic switch and control module as described above. In an embodiment, the electric motor is a three-phase brushless DC motor and the power switches include six Field Effect Transistors connected as a three-phase bridge rectifier. In an embodiment, the electric motor is rotatably coupled to a fan inside a motor housing, and the electric power module is disposed in a tool handle in fluid communication with the motor such that an airflow is generated by the fan through the handle to transfer heat away from the power switches within the open compartment. In an embodiment, the power tool is a drill or an impact driver. In an embodiment, the power tool includes a variable speed trigger or a forward/reverse button engaging the input unit.

According to another aspect of the invention, an electronic switch and control module for a power tool having an electric motor, comprising: a printed circuit board (PCB); an encapsulation member forming an enclosed compartment enclosing a portion of a surface of the PCB; a plurality of power switches mounted on the surface of the PCB outside the enclosed compartment, the power switches being electrically configured to switchably connect a supply of electric power from a power source to the electric motor; and an input unit having at least one electro-mechanical element at least partially disposed within the enclosed component and generating a signal for controlling a switching operation of the plurality of power switches.

In an embodiment, the electronic switch and control module includes a controller mounted on the PCB and coupled to the input unit and the plurality of power switches, and the controller is configured to control the switching operation of the power switches based the signal from the input unit. In an embodiment, the controller is mounted on a back surface of the PCB.

In an embodiment, the electronic switch and control module includes a heat sink arranged to transfer heat away from the power switches. In an alternative embodiment, the electronic switch and control module includes a plurality of heat sinks discretely mounted over a respective one of the plurality of power switches and secured to the surface of the PCB to transfer heat away from the power switches.

In an embodiment, the electro-mechanical element of the input unit includes a speed-sensing member on the surface of the PCB and a variable-speed actuator having a sliding member in sliding contact with the speed-sensing member, where the speed-sensing member and the sliding member are disposed and substantially enclosed within the enclosed compartment, and the speed-sensing member generates the signal for controlling a switching operation of the plurality of power switches based on a sliding position of the sliding member. In an embodiment, the variable-speed actuator further includes a variable-speed trigger disposed outside the enclosed compartment and a link slidably extending from the variable-speed through an aperture in the enclosed compartment into the enclosed compartment and coupled to the sliding member. In an embodiment, the speed-sensing member includes a series of conductive tracks on the surface of the PCB and the variable-speed actuator includes a conductive wiper in sliding contact with the conductive tracks. In an embodiment, the encapsulation member includes an axial chamber facilitating a sliding movement of the sliding member and restraining a lateral movement of sliding member away from the PCB.

In an embodiment, the electro-mechanical element of the input unit includes a contact-sensing member on the surface of the PCB and a forward/reverse actuator having a contact member in selective contact with the contact-sensing member, where the contact-sensing member and the contact member are disposed and substantially enclosed within the enclosed compartment, and the contact-sensing member generates the signal for controlling a rotational direction of the motor. In an embodiment, the forward/reverse actuator further includes a pivot member supported by the enclosed compartment and an engagement member extending outside the enclosed compartment from the pivot member, the pivot member pivotably linking the contact member and the engagement member. In an embodiment, the contact-sensing member comprises a pair of conductive tracks on the surface of the PCB and the contact member includes an electrical connector that selectively comes into contact with none, one, or both of the conductive tracks. In an embodiment, the encapsulation member includes a chamber facilitating a pivoting movement of the sliding member towards and away from the PCB.

In an embodiment, the electronic switch and control module further includes a module housing substantially encapsulating sides and a lower surface of the PCB. In an embodiment, the encapsulation member mates with a mating surface of the module housing to enclose the surface of the PCB within the enclosed compartment.

In an embodiment, an electric power tool is provided having an electric motor and an electronic switch and control module as described above. In an embodiment, the electric motor is a three-phase brushless DC motor and the power switches include six Field Effect Transistors connected as a three-phase bridge rectifier. In an embodiment, the electric motor is rotatably coupled to a fan inside a motor housing, and the electric power module is disposed in a tool handle in fluid communication with the motor such that an airflow is generated by the fan through the handle to transfer heat away from the power switches outside the closed compartment. In an embodiment, the power tool is a drill or an impact driver. In an embodiment, the power tool includes a variable speed trigger or a forward/reverse button engaging the input unit.

According to another aspect of the invention, an electronic switch and control module for a power tool having an electric motor is provided, comprising: a module housing including a bottom surface, side walls, and an open face; a printed circuit board (PCB) received from the open face of the module housing and securely disposed within the module housing at a distance from the bottom surface of the module housing; a plurality of power switches mounted on a top surface of the PCB, the power switches being electrically configured to switchably connect a supply of electric power from a power source to the electric motor; a plurality of heat sinks discretely arranged and each mounted over a respective one of the plurality of power switches and secured to the top surface of the PCB to transfer heat away from the power switch through the open face of the module housing; an input unit having a plurality of conductive tracks disposed on the PCB and an electro-mechanical element engaging the plurality of conductive tracks, the input unit generating a signal for controlling a switching operation of the plurality of power switches; and a controller mounted on the PCB coupled to the plurality of power switches and the input unit, where the controller is configured to control the switching operation of the power switches based the signal from the input unit.

In an embodiment, the conductive tracks are disposed on the top surface of the PCB.

In an embodiment, the controller is mounted on a lower surface of the PCB facing the bottom surface of the module housing, the controller being electronically connected to the power switches via a plurality of vias.

In an embodiment, the module housing includes retention features for securely holding the PCB at a distance from the bottom surface of the module housing.

In an embodiment, each heat sink includes a main plate disposed directly above the respective power switch at close proximity thereto, and at least one leg mounted on the PCB and electronically coupled to a drain of the respective power switch.

In an embodiment, the power switches are six Field Effect Transistors (FETs) configured as a three-phase bridge rectifier.

In an embodiment, the electronic switch and control module further includes a potting compound formed around the PCB within the housing but leaves a top surface of the heat sink exposed through the open face of the module housing. In an embodiment, the potting compound leaves exposed a main plate of the heat sink with a surface area of approximately between 20 to 30 mm$^2$.

In an embodiment, the electronic switch and control module includes an encapsulation member that substantially covers the input unit and includes a chamber housing the electro-mechanical element in engagement with the conductive tracks. In an embodiment, the encapsulation member mates with at least one of the side walls of the module housing and includes at least one of wire retention or wire guide features arranged to retain or guide wires coupled to the PCB.

In an embodiment, the electronic switch and control module includes a cover configured to mate with at least one of the side walls of the module housing to partially cover a portion of the PCB not including an area of the PCB where the plurality of power switches and plurality of heat sinks are mounted. In an embodiment, the cover includes at least one of wire retention or wire guide features arranged to retain or guide wires coupled to the PCB.

In an embodiment, an electric power tool is provided having an electric motor and an electronic switch and control module as described above. In an embodiment, the electric motor is a three-phase brushless DC motor and the power switches include six Field Effect Transistors connected as a three-phase bridge rectifier. In an embodiment, the electric motor is rotatably coupled to a fan inside a motor housing, and the electric power module is disposed in a tool handle in fluid communication with the motor such that an airflow is generated by the fan through the handle to transfer heat away from the power switches within the open compartment.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments of the present invention.

FIGS. 8A and 8B depict side and perspective views of a biasing member (forward/reverse spring), according to an embodiment;

DESCRIPTION

Figure 1:
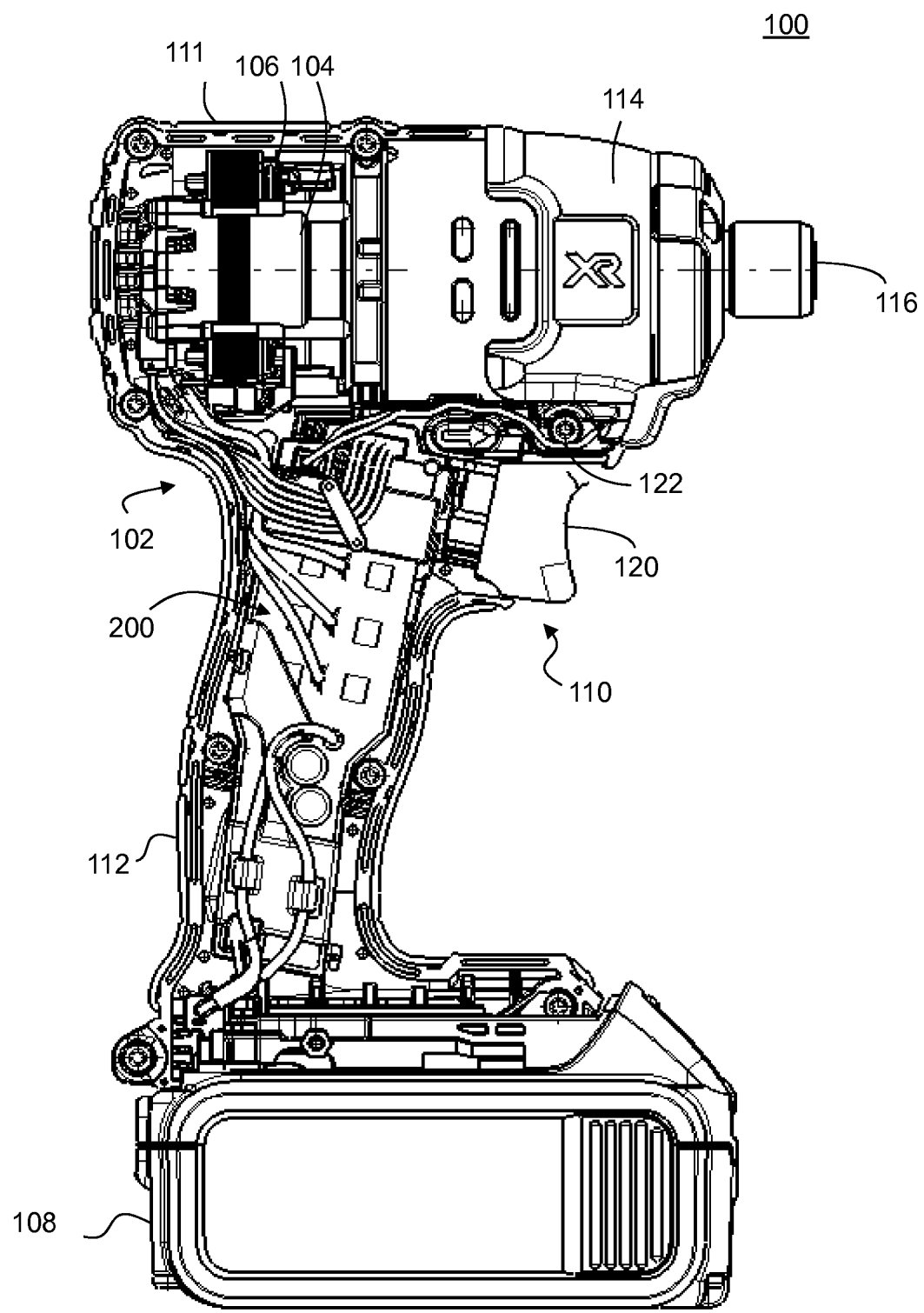
FIG. 1 depicts a longitudinal cross-sectional view of a power tool with a housing half removed, according to an embodiment.

With reference to the FIG. 1, a power tool 100 constructed in accordance with the teachings of the present disclosure is illustrated in a longitudinal cross-section view. Power tool 100 in the particular example provided may be a hand held impact driver, but it will be appreciated that the teachings of this disclosure is merely exemplary and the power tool of this invention could be any power tool. The power tool shown in FIG. 1 may include a housing 102, an electric motor 104, a battery pack 108, a transmission assembly (gear case) 114, and an output spindle 116. The gear case 114 may be removably coupled to the housing 102. The housing 102 can define a motor housing 111 and a handle 112.

According to an embodiment, motor 104 is received in motor housing 111. Motor 104 maybe be any type of motor and may be powered by an appropriate power source (electricity, pneumatic power, hydraulic power). In an embodiment, the motor is a brushless DC electric motor and is powered by a battery pack 108.

According to an embodiment of the invention, power tool 100 further includes an integrated electronic switch and control module 200 (hereinafter referred to as "electronic control module", or "control module"). Electronic control module 200, in an embodiment, may include a controller and electronic switching components for regulating the supply of power from the battery pack 108 to motor 105. In an embodiment, electronic control module 200 is disposed within the handle 112 below the motor housing 111, though it must be understood that depend on the power tool shape and specifications, electronic control module 200 may be disposed at any location within the power tool. Electronic control module may also integrally include components to support a user-actuated input unit 110 (hereinafter referred to as "input unit" 110) for receiving user functions, such as an on/off signal, variable-speed signal, and forward-reverse signal. In an embodiment, input unit 100 may include a variable-speed trigger 120, although other input mechanism such as a touch-sensor, a capacitive-sensor, a speed dial, etc. may also be utilized. In an embodiment, an on/off signal is generated upon initial actuation of the variable-speed trigger 120. In an embodiment, a forward/reverse button 122 is additionally provided on the tool 100. The forward/reverse button 122 may be pressed on either side of the tool in a forward, locked, or reverse position. In an embodiment, the associated circuitry and components of the input unit 110 that support the variable-speed trigger 120 and the forward/reverse button 122 may be fully or at least partially integrated into the electronic control module 200. Based on the input signals from the input unit 110 and associated components, the controller and electronic switching components of the electronic control module 200 modulate and regulate the supply of power from the battery pack 108 to motor 105. Details of the electronic control module 200 are discussed later in detail.

While in this embodiment, the power source is battery pack 108, it is envisioned that the teachings of this disclosures may be applied to a power tool with an AC power source. Such a power tool may include, for example, a rectifier circuit coupled to the AC power source.

It must be understood that, while FIG. 1 illustrates a power tool impact driver having a brushless motor, the teachings of this disclosure may be used in any power tool, including, but not limited to, drills, saws, nailers, fasteners, impact wrenches, grinders, sanders, cutters, etc. Also, teachings of this disclosure may be used in any other type of tool or product that include a rotary electric motor, including, but not limited to, mowers, string trimmers, vacuums, blowers, sweepers, edgers, etc.

Figure 2A:
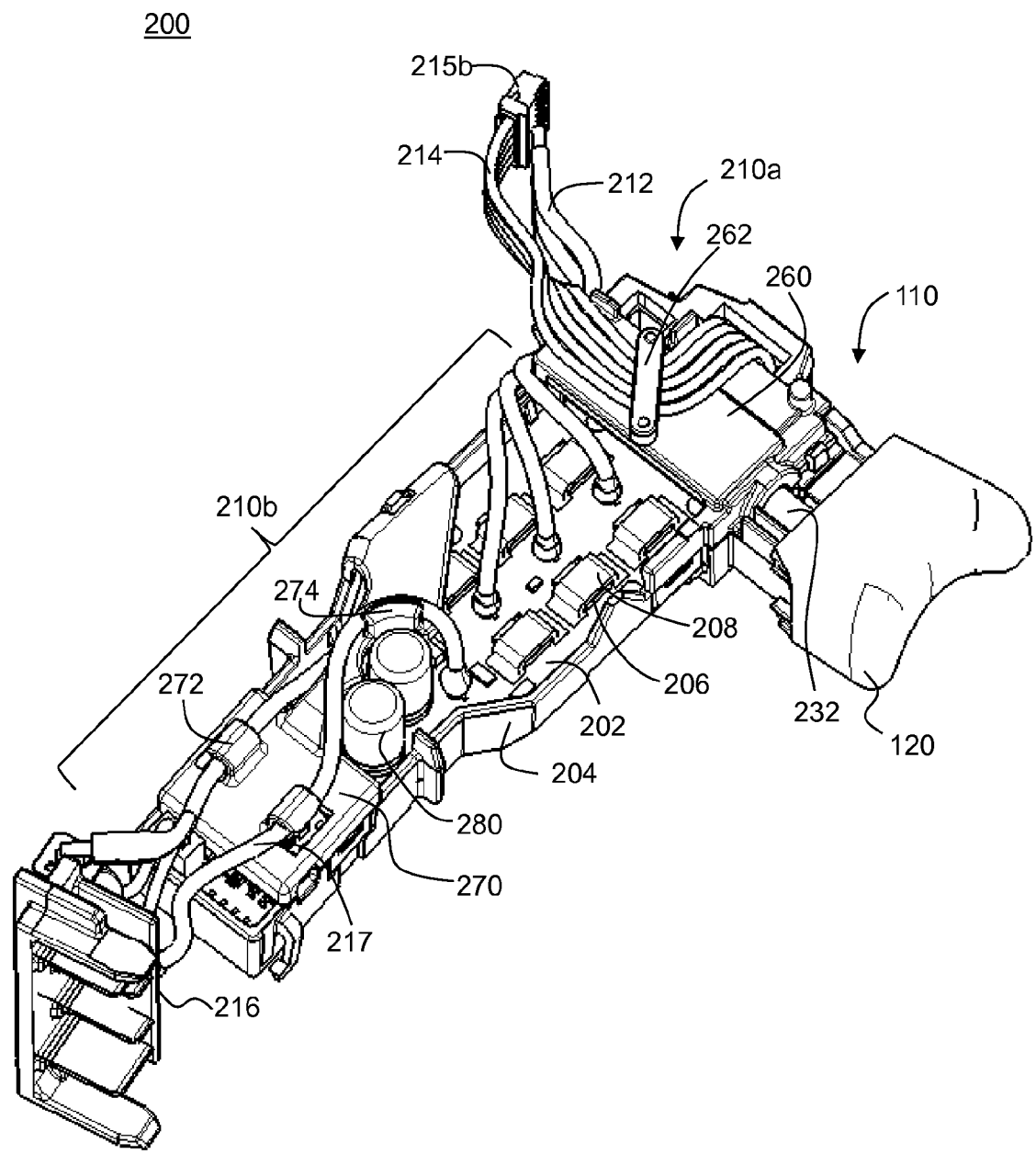
FIGS. 2A and 2B depict perspective views of an electronic control module from two different angles, according to an embodiment.
Figure 2B:
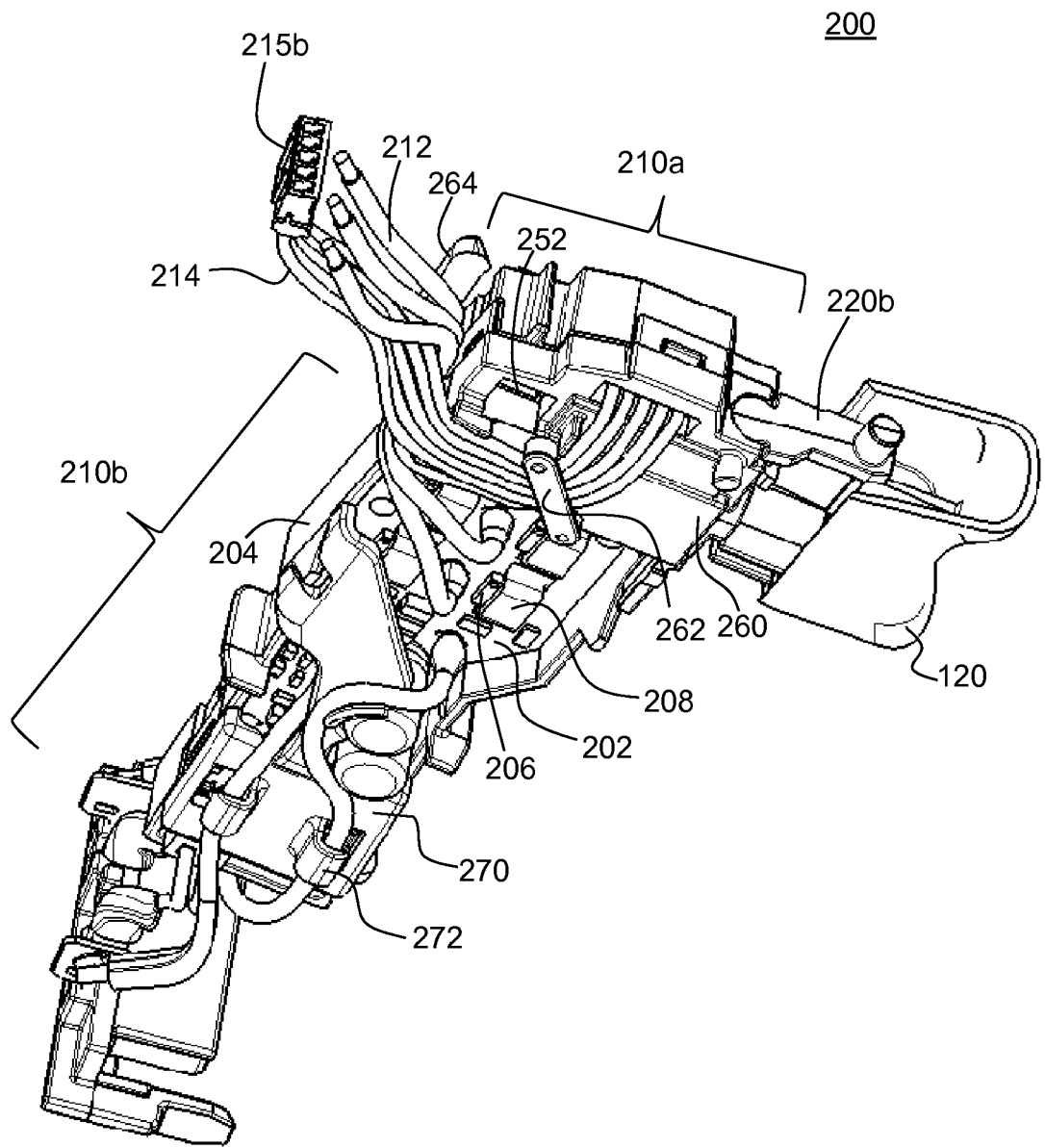
Figure 3A:
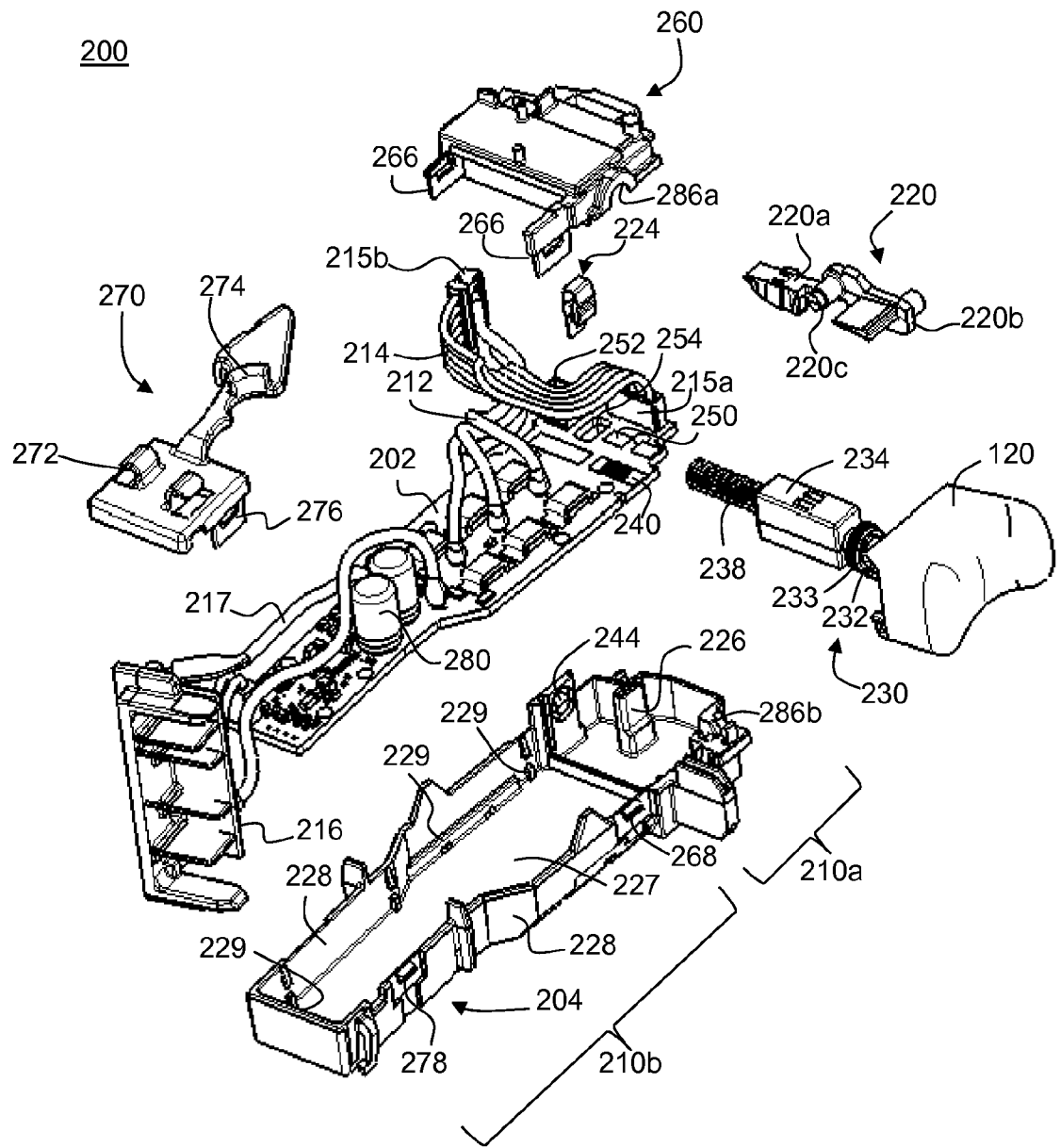
FIGS. 3A and 3B respectively depict expanded front and back perspective views of the electronic control module, according to an embodiment.
Figure 3B:
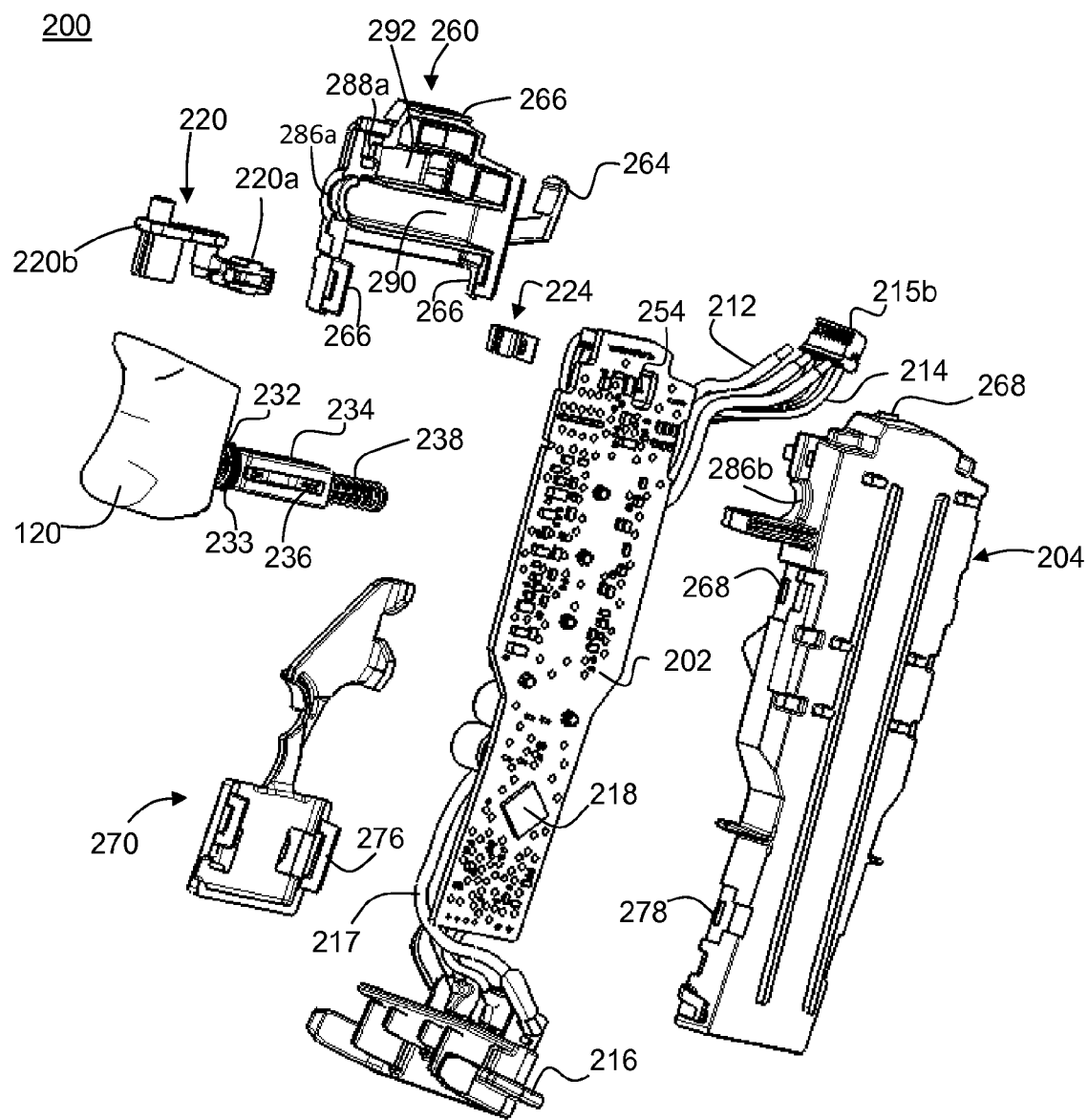

The electronic control module 200 is described herein, according to an embodiment of the invention. FIGS. 2A and 2B depict perspective views of electronic control module 200 from two different angles, according to an embodiment. FIG. 3A and 3B depict exploded front and back views of the same module 200, according to an embodiment. Reference is made to these drawings herein.

Electronic control module 200, in an embodiment, includes a printed circuit board (PCB) 202 arranged and mounted inside a module housing 204. Module housing 204 includes a bottom surface 227, side walls 228, and an open face. PCB 202 is inserted through the open face and secured inside the module housing 204. Side walls 228 include retention features 229 for securely holding the PCB 202 at a distance from the bottom surface 227. Control module 200 includes two compartments—an enclosed compartment 210a that houses and encloses a first part of the PCB 202 and components associated with the input unit 110, as described below, and an open compartment 210b, and partially encloses a second part of the PCB 202. Within the open compartment 210b, module housing 204 encloses the lower surface and the sides of PCB 202, but leaves the upper surface of the PCB 202 substantially exposed. Mounted on the upper surface of PCB 202 are a series of power switches 206 and a series of heat sinks disposed over the power switches 206 and secured to the PCB 202. As discussed below in detail, this arrangement allows cooling air to transfer heat away from the heat sinks 208 within the power tool 100, but protects the input unit 110 components from any dust and debris from the cooling air.

According to an embodiment, control module 200 includes a controller 218. In an embodiment, the controller may be mounted to a lower surface of the PCB 202 and be in electronic communication with the rest of the PCB 202 components through vias (not shown). In an embodiment, controller 218 may be a programmable micro-controller, micro-processor, or other processing unit capable of controlling the motor and various aspects of power tool. For example, controller 218 may be programmed to turn on and off power switches 206, as discussed below, to control commutation of the brushless motor. In an embodiment, controller 218 may be coupled to a series of gate drivers disposed on the PCB 202, which in turn are connected to the gates of the power switches 206. Alternatively, controller 218 may be a circuit chip that includes both a micro-controller and the gate drivers and be coupled directly to the gates of the power switches 206. Using the gate drivers, controller 218 turns the power switches 206 on or off selectively to commutate the motor and control the speed of the motor. Additionally, the controller may be programmed to various tool and battery pack operation features, such as tool and/or temperature control, battery pack voltage control, and tool over-current detection and control, etc. In an alternative embodiment, the controller may be an Application Specific Integrated Circuit (ASIC) configured to control the aforementioned aspects of the motor, battery, and power tool.

In an exemplary embodiment, power switches 206 may be Field Effect Transistors (FETs). In an embodiment, six power switches 206, including three high-side power switches and three low-side power switches, are arranged and coupled together as a three-phase bridge rectifier circuit. Using the gate drivers, controller 218 sequentially turns the power switches 206 on and off within each phase of the brush motor 104 commutation. Further, the controller 218 performs pulse-width modulation (PWM) of the power switches 206 within each phase to regulate the speed of the motor based on speed signals received from input unit 110, as described below. Controller 218 further controls the direction of motor commutation based on a forward/reverse signal received from input unit 110, also discussed below.

It is noted that while the power switches 206 discussed herein are FETs, other types of power switches such as BJTs or IGBTs may be utilized. Additionally, while power switches 206 are arranged as a three-phase bridge rectifier for driving a three-phase brushless motor, other number and arrangement of power switches may be used to drive other types of motors, including brushed or brushless motors.

As described above, module housing 204 leaves the upper surface of the PCB 202 exposed, thus allowing heat to dissipate from the heat sinks 208. Electronic control module 200 may be placed within a path of air flow inside the power tool, e.g., inside the power tool handle 112 in fluid communication with motor fan 106 so that airflow generated by motor fan 106 runs through the handle 112. The air flow generated within the handle further improves heat dissipation from the electronic control module 200.

In an embodiment, the PCB 202 is further potted with a layer of potting compound (not shown) in the open compartment 210b. The layer of potting compound, in an embodiment, substantially covers most of the circuit components on the PCB, but leave a top plate of heat sinks 206 exposed so the heat sinks 208 can dissipate heat away from the power switches 206. While the potting compound is not shown in FIGS. 2A-3B, the control module of FIG. 1 is shows with the potting compound disposed inside the housing 202.

Figure 4A:
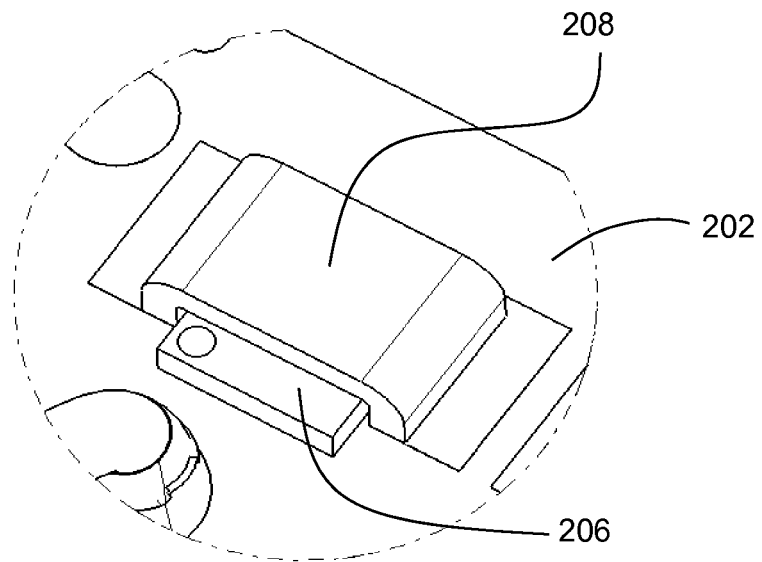
FIGS. 4A and 4B respectively depict a zoomed-in perspective view and a cross-sectional view of a the electronic control module showing the arrangement of a power switch and a heat sink on a printed circuit board (PCB), according to an embodiment.
Figure 4B:
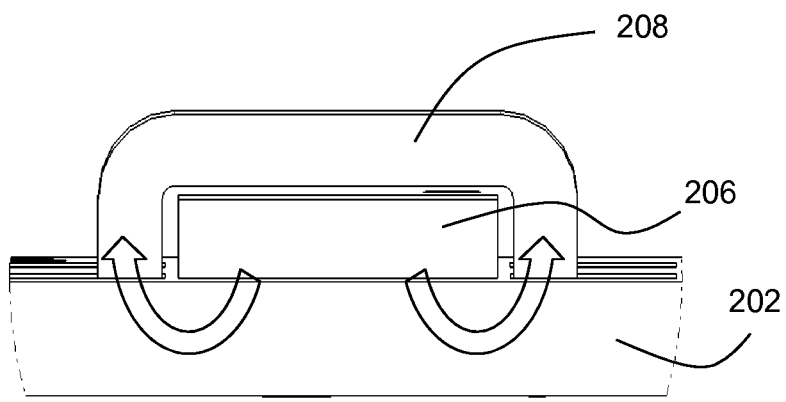

FIGS. 4A and 4B depict zoomed-in perspective and cross-sectional views of PCB 202, showing the arrangement of heat sink 208 and power switch 206 (in this case a FET) mounted over PCB 202, according to an embodiment. Heat sink 208 includes two legs mounted on the PCB 202. The main plate of heat sink 208 is located directly above power switch 206 at close proximity thereto. This allows heat to be transferred directly from power switch 206 to the heat sink 208 through a small air gap between the two. In an embodiment, the main plate of the heat sink 208 has a surface area of 10 to 40 mm$^2$, preferably 15-35 mm$^2$, more preferably 20-30 mm$^2$, that is exposed after the potting compound is applied. In addition, one or more of the legs of the heat sink 208 is electrically connected to the drain of power switch 206 on the PCB 202. This arrangement further improves heat transfer from the FET 206 to the heat sink 208.

It is noted that while in this embodiment discrete heat sinks 208 are mounted on respective power switches 206, a lower number of heat sinks 208 may be utilized instead. In an alternative embodiment of the invention, a single heat sink is mounted on the PCB over the power switches 206 to provide a higher surface area for heat transfer.

Referring back to FIGS. 2A through 3B, in an embodiment, a series of output wires 212 are secured on one end to a surface of the PCB 202. These wires connect the outputs of the power switches three-phase bridge rectifier to the power terminals the brushless motor 104. In an embodiment, a series of control signal wires 214 are also secured to a wire receptacle 215a. In an embodiment, wire receptacle 215a is mounted on the PCB and is in electrical communication with the controller 218. The control signal wires 214 allow the controller 218 to communicate with other parts of the power tool 100, such as the motor 104 and the battery 108. In an embodiment, hall signals from the brushless motor hall sensors communicate with the controller 218 through these control signal wires 214. Control signal wires 214 may additionally be provided with a control terminal 215b to ease plug-in connectivity of external wires with the control signal wires 214. In an embodiment, a pair of power input wires 217 are also secured on the surface of PCB 202. These wires are coupled to a power source (e.g., battery 108) via a power terminal 216 to supply power from the power source to the power switches 206.

In an embodiment, control module 200 includes an encapsulation member 260 that mates with the module housing 204 to form the enclosed compartment 210a of control module 200. As discussed below in detail, encapsulation member 260 protects components associated with input unit 110 from dust and debris. Encapsulation member 260 also includes wire retaining features 262 and wire guide features 264 for retaining and positioning signal wires 214 and/or power output wires 212 away from the housing 204. Encapsulation member 260 further includes mating features 266 that mate with corresponding mating features 268 on the module housing 204. In an embodiment, the mating features 268 include lips that snap fit into slots in mating features 266. In an embodiment, encapsulation member 260 further includes an opening 269 that allows control signal wires 214 to connect to PCB-side control terminal 215a.

Additionally, in an embodiment, control module 200 includes an additional cover 270 that covers a lower portion of PCB 202. Cover 270 also includes wire retaining features 272 for retaining the power wires 217, as well as wire guide features 274 for guiding the wires 217 around circuit components (e.g., capacitors 280) mounted on PCB 202. Cover 270 further includes mating features 276 that mate with corresponding mating features 278 on the module housing 204. In an embodiment, the mating features 278 include lips that snap-fit into slots in mating features 276.

In an embodiment, control module 200 is additionally provided with an auxiliary control terminal 252 mounted on a top portion of the PCB 202 that allows the controller 218 with other motor or tool components. In an embodiment, auxiliary control terminal 252 allows the controller 218 to communicate with an LED provided on the tool 100. In an embodiment, auxiliary control terminal 252 is provided outside and adjacent to the enclosed compartment 210a.

The input unit 110 is discussed herein, according to an embodiment of the invention. According to an embodiment, input unit 110 is at least partially integrated into control module 200. In an embodiment, input unit 110 incorporates electro-mechanical elements for variable-speed detection, on/off detection, and forward/reverse detection inside the enclosed compartment 210a of control module 200, as discussed herein.

In an embodiment, input unit 110 includes a forward/reverse actuator 220 supported by the enclosed compartment 210a portion of the module housing 204. In an embodiment, forward/reverse actuator 220 includes a contact member 220a, which holds an electrical connector 222 and is disposed inside the enclosed compartment 210a of the module housing 204, and an engagement member 220b, which is located outside the module housing 204. In an embodiment, engagement member 220b is in moving contact with forward/reverse button 122 on the power tool 100. A pivot member 220c located between the contact member 220a and engagement member 220b is supported by the module housing 204 and provides a pivot point for the forward/reverse actuator. A biasing member 224 is secured to the module housing 204 to engage and bias the contact member 220a in a forward, neutral (e.g., locked), or reverse direction. In an embodiment, biasing member 224 is secured in an opening of a holder, i.e. a post 226 that projects from the bottom surface 227 of the module housing 204 within the enclosed compartment 210a. In an embodiment, PCB 202 is provided with a through-hole 254 that receives the post 226. When the user presses the forward/reverse button 122 from either side of the tool to a forward, locked, or reverse position, the forward/reverse button 122 moves the engagement member 220 around the pivot portion 220c. Pivoting movement of the engagement member 220b around the pivot portion 220c causes the electrical connector 222 of contact member 220a to make or break contact with a contact-sensing member against the biasing force of the biasing member 224. In an embodiment, contact sense member includes a pair of conductive tracks 250 arranged on PCB 202.

In an embodiment, one of the conductive tracks 250 is electrically connected to power source 108 and the other is connected to and sensed by controller 218. Voltage is present and sensed by the controller 218 when electrical connector 222 makes contact with the pair of conductive tracks 250, thus electrically connecting the two conductive tracks 250. Presence or lack of sensed voltage is indicative of whether the motor should rotate in the forward or reverse direction. Functional details of use and electrical connectivity of conductive tracks 250 for forward/reserve detection are discuss in co-pending Patent Publication no. 2012/0292063 filed May 21, 2012, which is incorporated herein by reference in its entirety.

According to an embodiment, input unit 110 further includes a variable-speed actuator 230. Variable-speed actuator includes a link member 232 that extends out of the module housing 204 from a sliding member 234 that is arranged inside the module housing 204 and supports a conductive wiper 236. Link member 232 is coupled to trigger 120 that is engageable by the user. The sliding member 234 supports and engages a compression spring 238 its longitudinal end opposite link member 232. Compression spring 238 is located between an inner wall of the module housing 204 and the sliding member 234. When the user presses the trigger 120, the sliding member 234 moves against a biasing force of the spring 238.

Conductive wiper 236 contacts a speed-sensing member located on the surface of the PCB 202. In an embodiment, the speed-sensing member is a series of variable-speed conductive tracks 240 arranged on the PCB 202. Actuation of the trigger 120 moves the conductive wiper 236 over the conductive tracks 240. Initial movement of the conductive wiper 236 over the conductive tracks 240 generates a signal that turns controller 218 ON. Additionally, an analog variable-voltage signal is generated based on the movement of the conductive wiper 128 over the conductive tracks and that signal is sent to the micro-controller. This signal is indicative of the desired motor speed. Functional details of ON/OFF and variable-speed detection using conductive tracks 240 are discuss in co-pending Patent Publication no. 2012/0292063 filed May 21, 2012, which is incorporated herein by reference in its entirety. It must be understood, however, that any known variable-voltage speed-sensing mechanism, such as a resistive tape, may be a utilized within the scope of the invention.

It is noted that the moving mechanical parts of the forward/reverse actuator 220 and variable-speed actuator 230 (including the electrical connector 222 and conductive wiper 236), alone or in combination with conductive tracks 240 and 250, are referred to in this disclosure as "electro-mechanical" elements.

Figure 5:
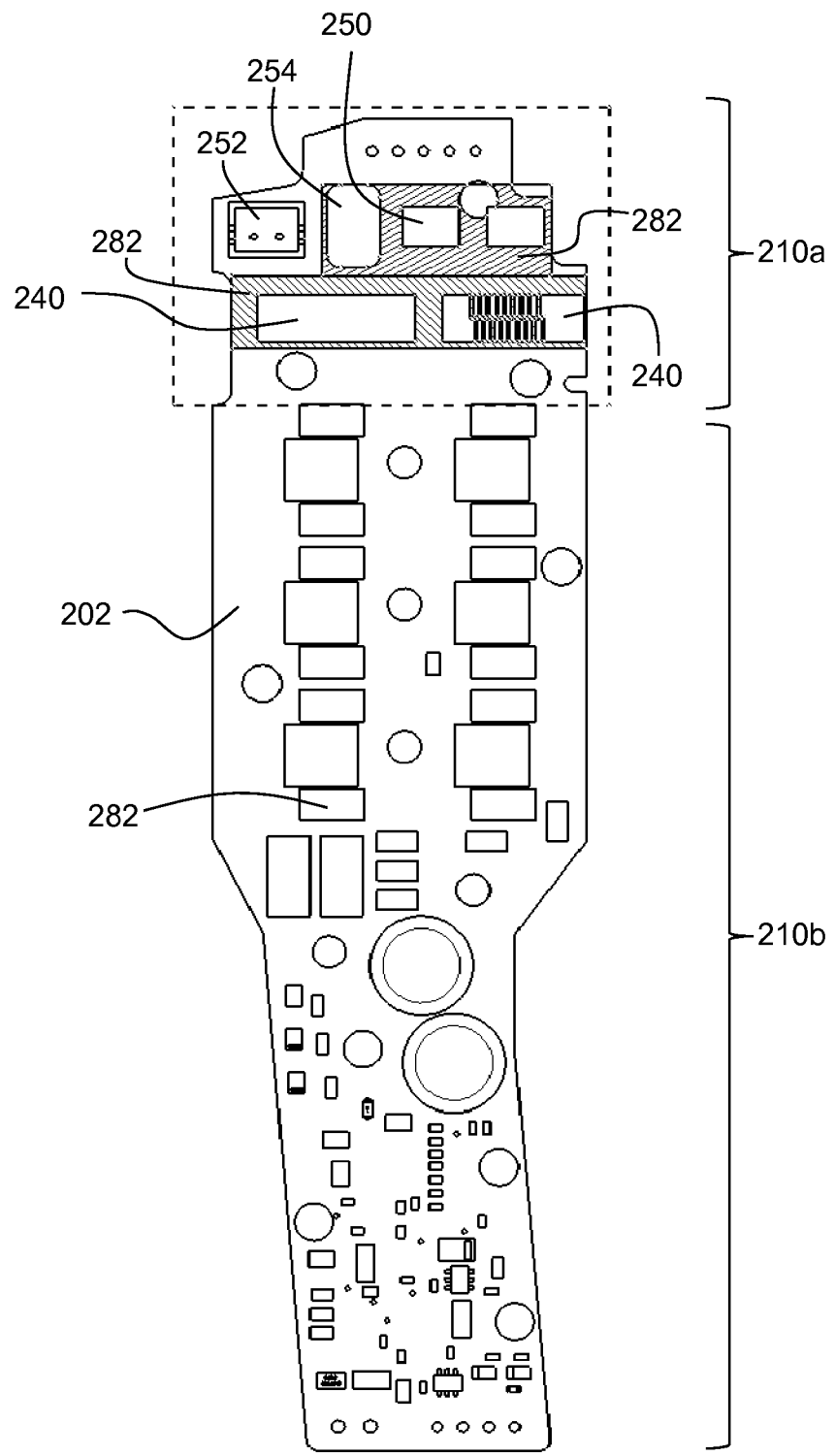
FIG. 5 depicts a top view of the PCB alone without any mounted components, according to an embodiment.

FIG. 5 depicts a top view of PCB 202 alone without any components mounted. As shown herein, PCB 202 is provided with metal traces 282 for mounting the power switches 206, as well as variable-speed conductive tracks 240 and forward/reverse conductive 250. Through-hole 254 and auxiliary terminal 252 is also shown in this figure.

In an embodiment, a layer of silicon conformal coating is applied to the PCB 202 to protect it from dust, debris, moisture, and extreme temperature changes. However, since the conductive tracks 250 and 240 need to remain exposed to make electrical contact with the forward/reverse electrical connector 222 and variable-speed conductive wiper 236, a high temperature resistant tape 284 is applied to the PCB 202 over the conductive tracks 240 and 250 before the silicon conformal coating is applied. The high temperature resistant tape 284 ensures that the silicon conformal coating does not cover the conductive tracks 240 and 250.

In an embodiment, since no conformal coating is provided to protect the conductive tracks 250 and 240, conductive tracks 250 and 240 are prone to damage from debris, contamination, and moisture. In addition, electro-mechanical components of the input unit (i.e., forward/reverse actuator 220 and variable-speed actuator 230, particularly forward/reverse electrical connector 222 and variable-speed conductive wiper 236) are also similarly prone to damage or faulty contact with the conductive tracks 200 and 250. For this reason, the conductive tracks 250 and 240 and the electro-mechanical elements of the input unit 110 are arranged inside the enclosed compartment 210a of the control module 200, where the encapsulation member 260 mates with the module housing 204 to seal and protect these components from dust, contamination, and/or moisture. In an embodiment, encapsulation member 260 substantially encloses the area 284 around the conductive tracks 250 and 240. In an embodiment, encapsulation member also encloses the space around the electro-mechanical components including contact member 220a of the forward/reverse actuator 220, sliding member 234 of the variable-speed actuator 230, spring 238, etc.

Referring back to FIGS. 3A and 3C, in an embodiment, mating surfaces of encapsulation member 260 and module housing 204 includes support features 286a, 286b that receive and support link member 232 of variable-speed actuator 230, forming an aperture for the link member 232 to slidably extend out of the module housing 204. In an embodiment, the link member 232 is laterally secured in the aperture via one or more rings 233. Similarly, mating surfaces of encapsulation member 260 and module housing 204 includes pivot support features 288a, 288b that receive and support pivot member 220c of forward/reverse actuator 220, forming an aperture for the engagement member 220b of the forward/reverse actuator 220 to extend out of the module housing 204.

In an embodiment, encapsulation member 260 not only protects the input unit 110 from dust and contamination, it also acts as a mechanical constrain for its mechanical components. In an embodiment, encapsulation member 260 includes a first chamber 290 that houses the sliding member 234 and compression spring 238 of the variable-speed actuator 230, and a second chamber 292 that houses the contact member 220a of the forward/reverse actuator 220. The first chamber 290 forms an axial channel for the back and forth movement of the sliding member 234 and mechanically restrains its lateral movement. In an embodiment, this arrangement ensures that there is always contact between the wiper 236 and the conductive tracks 240. Similarly, the second chamber 290 facilitates the pivoting movement of the forward/reverse actuator 220.

Figure 6:
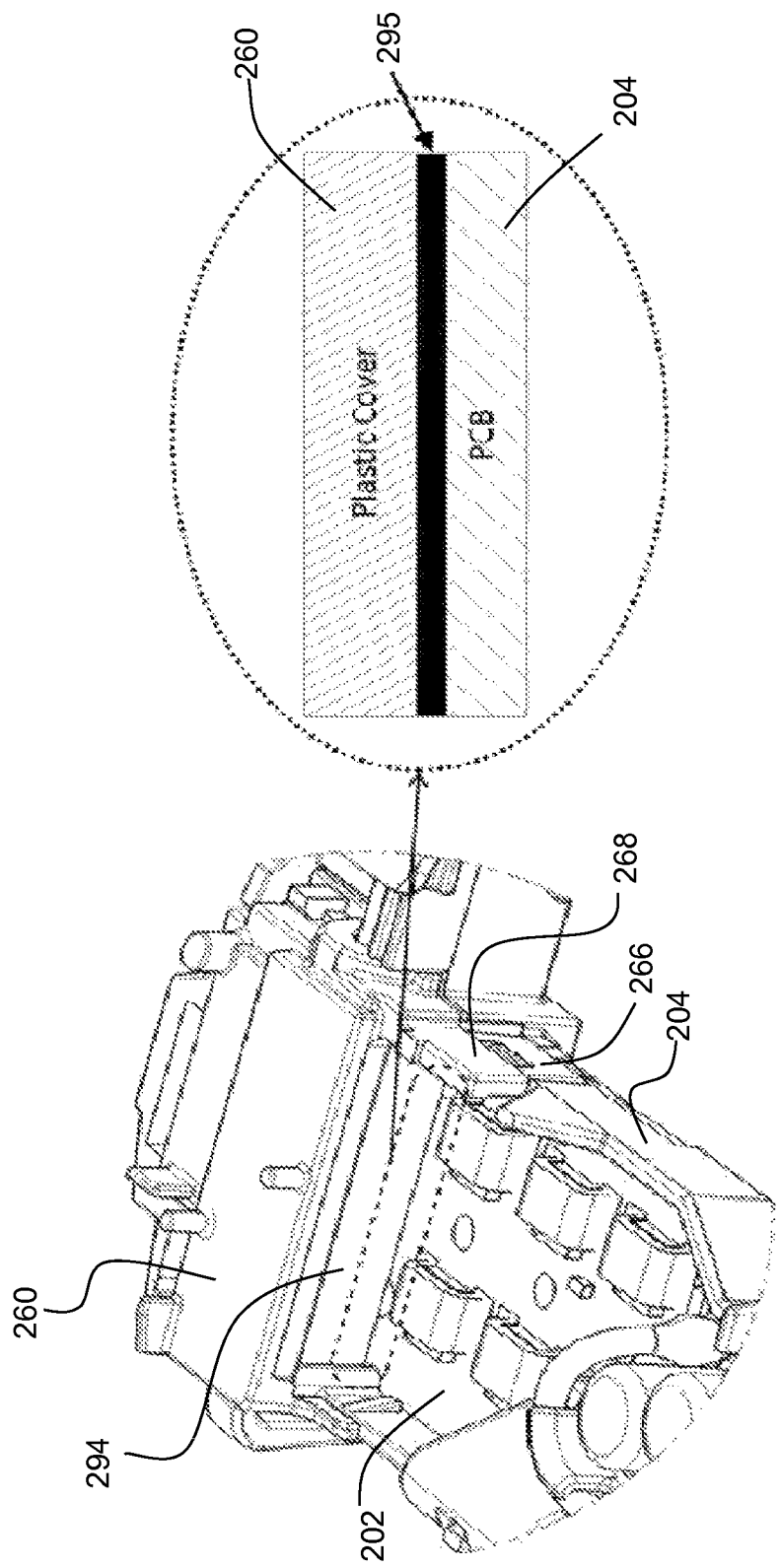
FIG. 6 depicts a partial perspective view of the electronic control module showing an encapsulation member sealed over the PCB, according to an embodiment.
Figure 7:
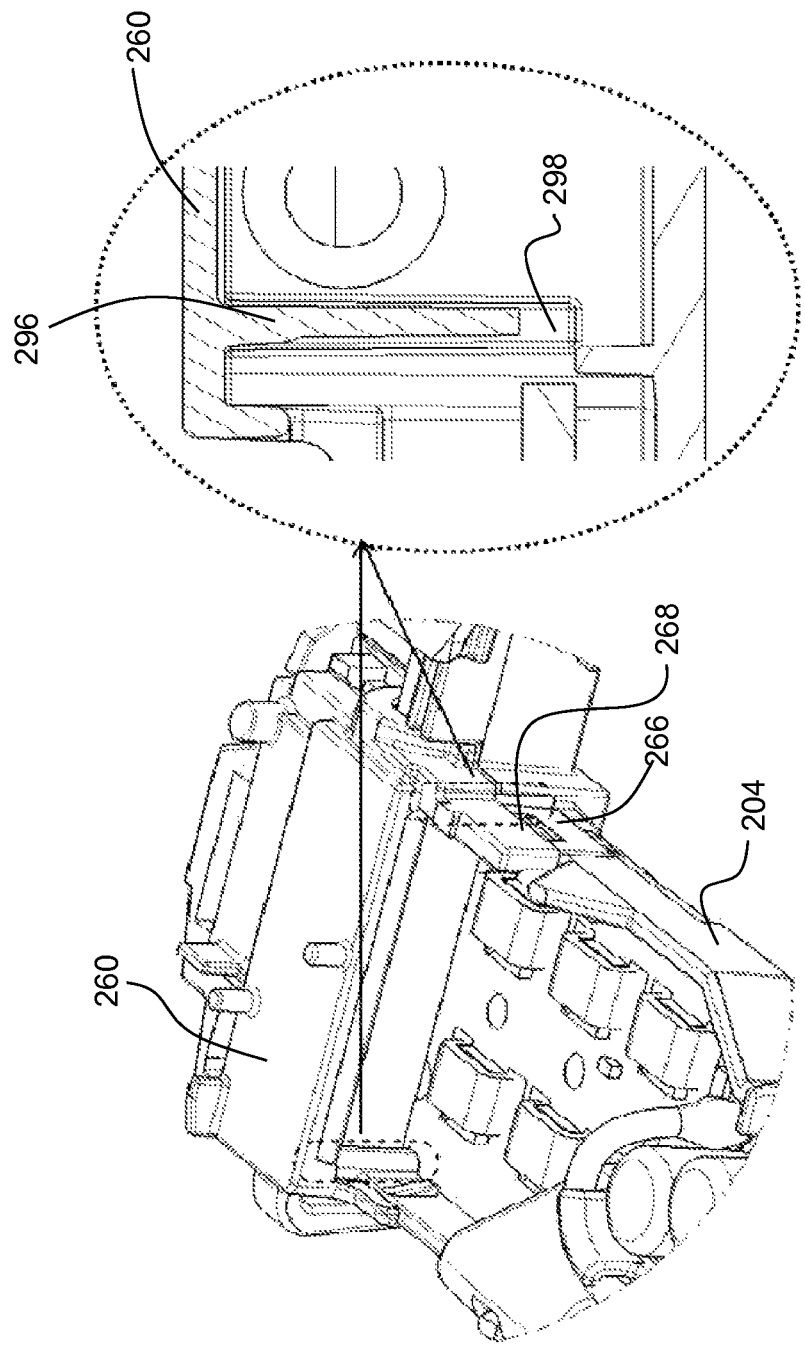
FIG. 7 depicts a partial perspective view of the electronic control module showing mating features for mounting the encapsulation member to the control module housing, according to an embodiment.

Referring now to FIGS. 6 and 7, additional features for sealing the enclosed compartment 210a from outside contamination are discussed herein, according to an embodiment.

As shown in FIG. 6, according to an embodiment, encapsulation member 260 includes a wall 294 arranged to rest on the PCB 202 when the encapsulation member 260 is mounted in order to fully enclose the enclosed compartment 210a, in an embodiment. In an embodiment, an adhesive may be applied to block any gaps between the wall 294 and the PCB 202. Alternatively, in an embodiment, during the assembly process, encapsulation member 260 is mounted on the module housing 204 immediately or shortly after conformal coating 295 is applied to PCB 202, preferably prior to conformal coating 295 cooing down. In this manner, once conformal coating 295 is cooled and hardened, it acts as a seal between the wall 294 of the encapsulation member 260 and the PCB 202.

As shown in FIG. 7, and as discussed above, encapsulation member 260 further includes mating features 266 that mate with corresponding mating features 268 on the module housing 204. In an embodiment, mating surfaces of encapsulation member 260 and module housing 204 are additionally respectively provided with tongue 296 and groove 298 features to seal the mating surfaces of encapsulation member 260 and the housing 204 and block or reduce entry of dust or contamination into the enclosed compartment 210a.

While exemplary embodiments of the invention are discussed with reference to a module housing 204, it must be understood that the compartmental concepts of the invention for sealing the electro-mechanical components associated with the input unit 101 components while leaving the power switches 206 exposed may be applied to alternative embodiments. For example, it is envisioned that a PCB 202 is disposed within a tool housing 102 without a separate module housing 204. In that case, an encapsulation member may be provided to around the enclosed compartment 210a of the PCB 202, with walls mounted and sealed to both surfaces of the PCB 202. Alternatively, encapsulation member may be mounted directly on the PCB 202 without a need for a separate module housing 204. It is also envisioned that in some alternative embodiments, the enclosed compartment 210a is formed by an integral part of the tool housing 204 rather than a separate piece.

Another aspect of the invention is described herein with reference to FIGS. 8 and 9A-9C.

As described above, most power tools used for drilling and cutting operations need to be operated in both forward and reverse directions. The forward/reverse actuator 220 described above is provided for that purpose. Moreover, in an embodiment, the forward/reverse actuator 220 may be provided with a third setting—a locked position—to secure lock the power tool system from running inadvertently. Effective, repeatable and reliable positional control of the contact member 220a (hereinafter also referred to as "lever" 220a) is needed to provide all three functions (i.e., forward run, reverse run, and lock). In an embodiment, this position control is provided by biasing member 224 (herein also referred to as forward/reverse spring 224), described herein.

In an embodiment, forward/reverse spring 224 includes a lever engaging member 302 that includes upper and lower portions 302a and 302b with a groove formed 302c therebetween. In an embodiment, the upper and lower portions 302a, 302b are arranged at an obtuse angle θ of approximately 120 to 150 degrees with respect to one another. The groove 302c is formed at the end common point (vertex) of the angle between the upper and lower portions 302a, 302b, towards the interior of the angle. The lever engaging member 302 engages a contact tip 300 of lever 220a of the forward/reverse actuator 220 to bias the forward/reverse actuator 220 in a forward (FIG. 9A), locked (FIG. 9B), or reverse (FIG. 9C) positions. Extending longitudinally from an end of upper portion 302a is an extension portion 304 that is substantially horizontal with respect to a plane of the PCB 202. A first leg 306 extends downwardly from an end of the extension portion 304 at close to a right angle. First leg 306 is securely places in an opening between first and second walls 320, 322 of post 226 projecting from a bottom surface 227 of the module housing 204. In an embodiment, first leg 306 includes an angular rib 308 that engages first wall 320 to secure the first leg 306 within the opening. In an embodiment, first leg 306 also includes a humped surface 310 that is pressed against the first wall 320 to provide further stability. In an embodiment, extending from an end of the lower portion 302b is a second leg 312 folding inwardly and positioned between the lever engaging member 302 and the first leg 306. In an embodiment, the second leg 312 extends upwardly along an axis that is less than parallel to an axis of the first leg 306 (e.g., where the two axes for an angle of less than 20 degrees, preferably less than 10 degrees). When assembled, second leg 312 engages an outer face of second wall 322 of the post 226. Second leg 312 includes a contact portion 314 that makes contact with the outer face of second wall 322, in an embodiment.

Figure 9A:
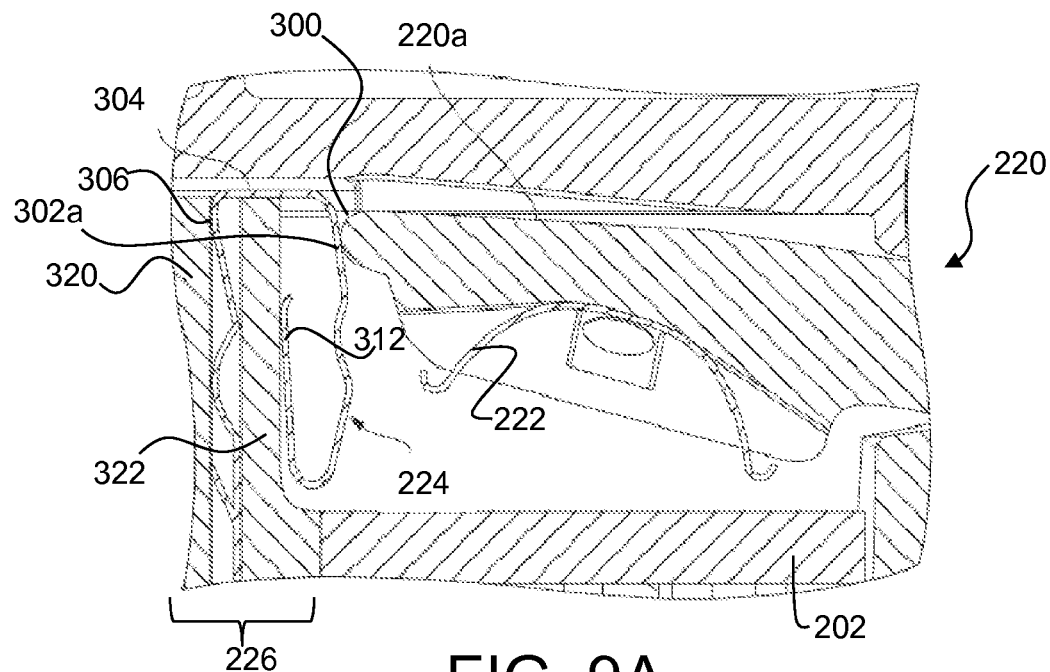
FIGS. 9A-9C depict cross-sectional views of a forward/reverse actuator relative to the biasing member in forward, locked, and reverse positions, respectively, according to an embodiment.

As shown in FIG. 9A, in a forward direction, contact tip 300 engages the upper portion 302a of the lever engaging member 302 and is biased away from the PCB 202. In this position, the biasing force is applied by the upper portion 302a and a top of the first leg 306 of the forward/reverse spring 224, which is resiliently forced towards the first wall 320. The second leg 312 in this position has minimal or no contact with the second wall 322 and thus applies less biasing force on the contact tip 300.

Figure 9B:
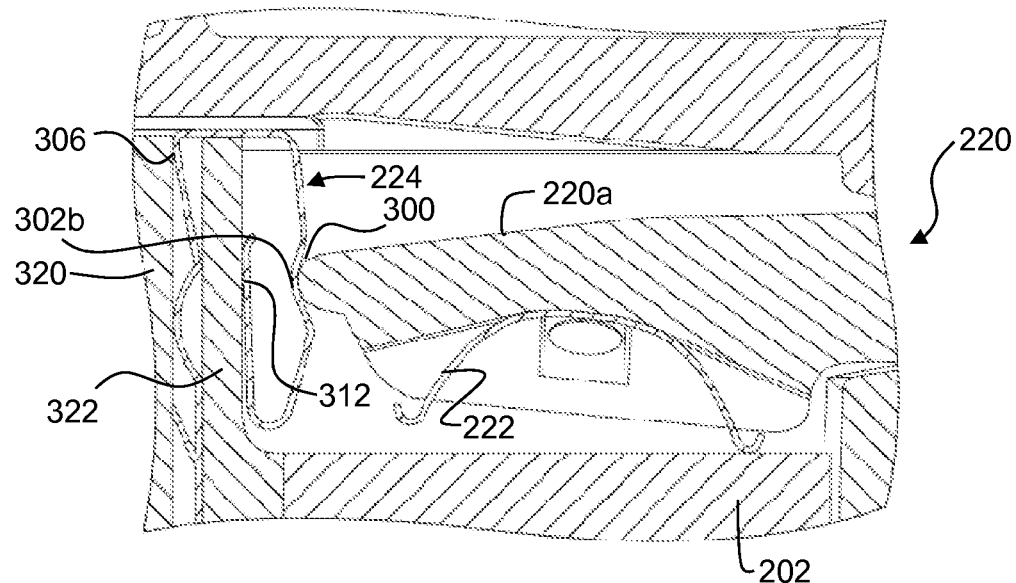

As shown in FIG. 9B, as the forward/reverse actuator 220 is pivoted to the locked position, contact tip 300 slides down the upper portion 302a until it reaches the groove 302c of the lever engaging member 302. As the contact tip 300 slides down, the biasing force on the contact tip 300 is applied by both the first and second legs 306 and 312 against the first and second walls 320 and 322, respectively. When in the locked position, in an embodiment, only one leg of the electrical connector 222 is in contact with the PCB 202.

Figure 9C:
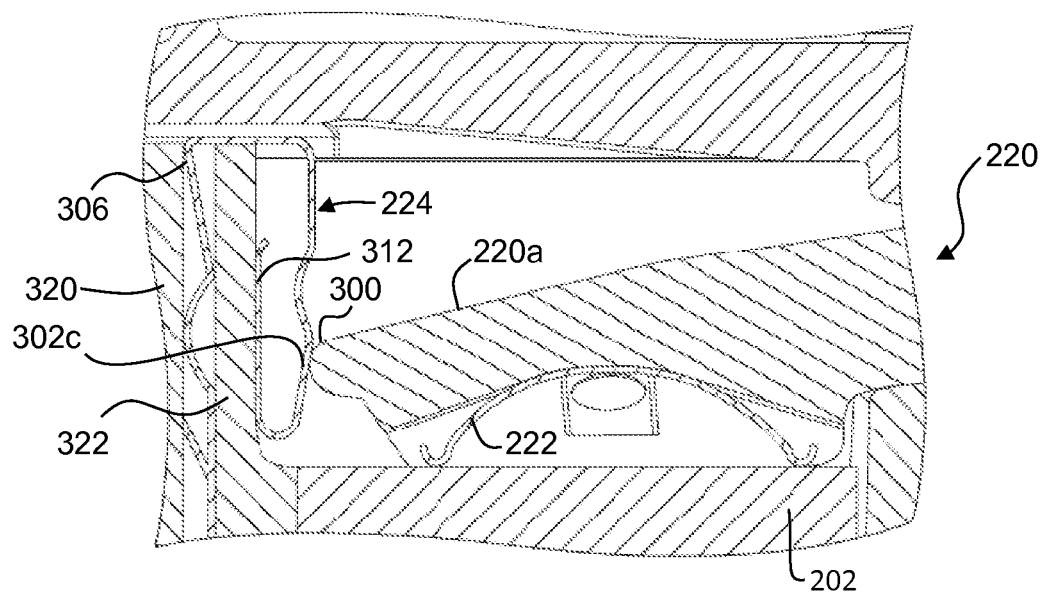

As shown in FIG. 9C, as the forward/reverse actuator 220 is pivoted to the reverse position, contact tip 300 slides down from the groove 302c over the lower portion 302b of the lever engaging member 302. As the contact tip 300 slides down, the biasing force on the contact tip 300 is applied mostly by the second legs 312, which comes into substantial contact with the second wall 322. When in the reverse position, in an embodiment, both legs of the electrical connector 222 are in contact with the conductive tracks 250 on the PCB 202, which send a voltage signal to the controller 218 indicative of the reverse position.

It is noted that forward/reverse spring 224 is very easy to assemble into the housing 204. Whereas conventional designs required complicated retention features and precision assembly, assembling the forward/reverse spring 224 simply involves insertion of the first leg 306 into the post 226 opening.

In an embodiment, each leg of the electrical connector 222 includes a curved profile, as shown in FIGS. 9A-9C. This profile allows the electrical connector 222 to have a smoother transition as it makes contact and slides over the conductive tracks 250 of the PCB 202.

Figure 10:
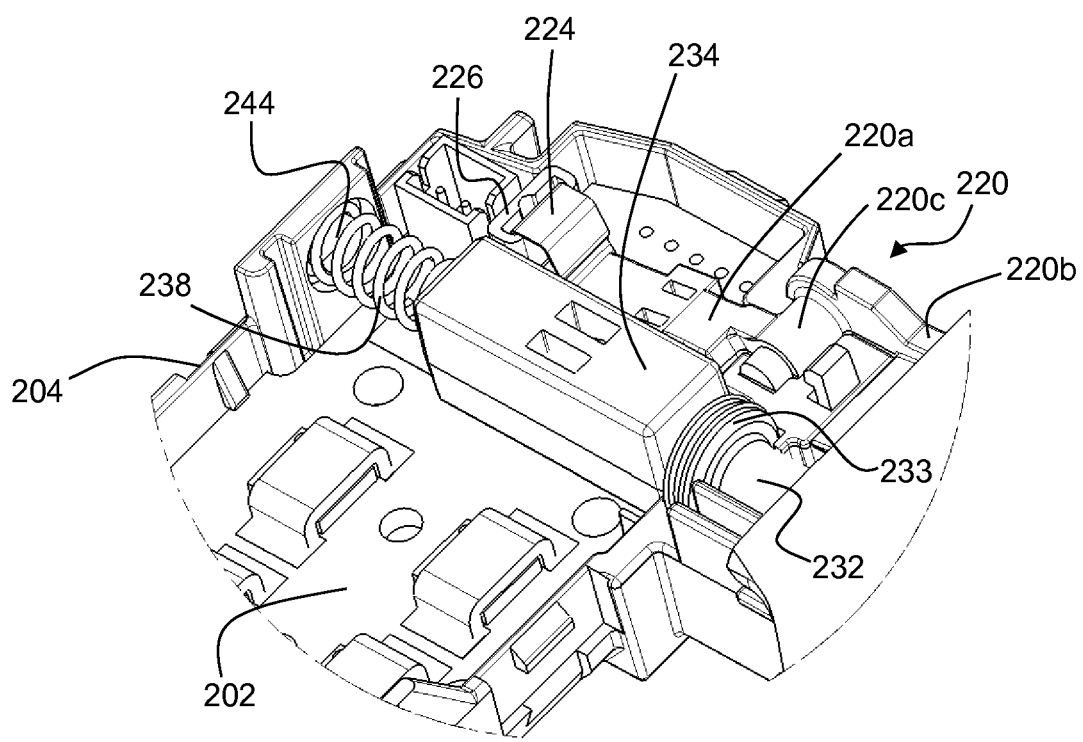
FIG. 10 depicts a partial perspective view of the electronic control module without the encapsulation member, according to an embodiment.

FIG. 10 provides a zoomed-in view depicting the arrangement of the forward/reverse actuator 220 and forward/reverse spring 224 within the housing 204, according to an embodiment.

Figure 11:
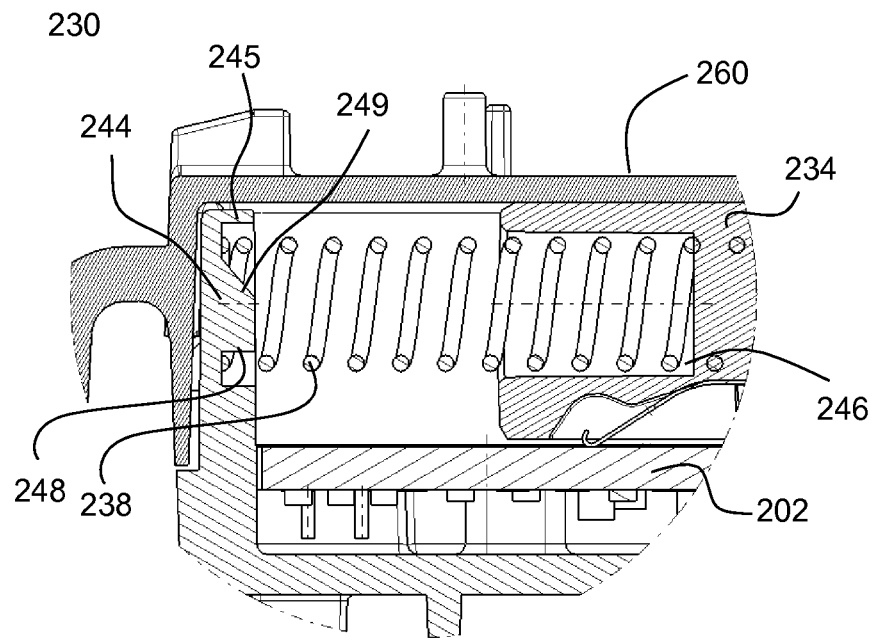
FIG. 11 depicts a cross-sectional view of the variable-speed actuator within the enclosed compartment, according to an embodiment.
Figure 12:
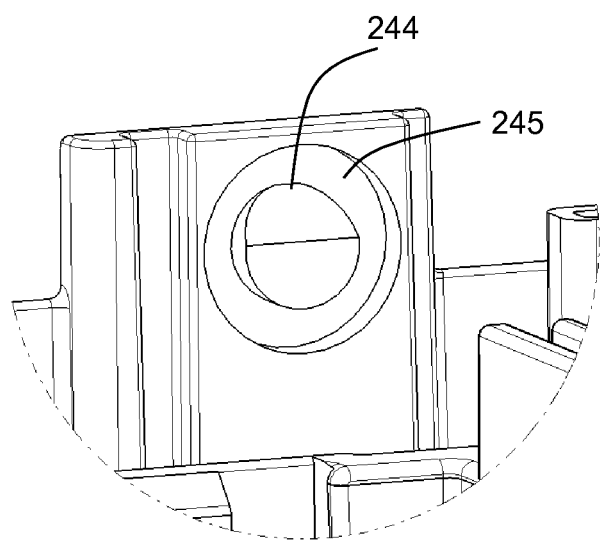
FIG. 12 depicts a zoomed-in view of a post for the variable-speed compression spring, according to an embodiment.

Another aspect of the invention is described herein with reference to FIGS. 10-12. As discussed above, compression spring 238, sliding member 234, and link member 232 of the variable-speed actuator 230 are enclosed by encapsulation member 260. During the assembly process, the spring 238 is at least partially compressed to allow its first end to engage the sliding member 234 and its second end to engage another restraining member, such as an inner wall of the housing

204. Since the spring 238 has to be left in its partially-compressed state, it is difficult to hold spring 238 down in place while the encapsulation cover 240 is mounted on the module housing 204 as the spring 238 tends to spring out of place.

To solve this problem, according to an embodiment of the invention, a spring post 244 is provided on the inner wall of the housing 204 where an end of the compression spring 238 makes contact. In an embodiment, a pocket 245 is additionally provided as a recess within the inner wall of the module housing 204 and the post 244 projects from a center of the pocket 245. In other words, the pocket 245 forms as a halo around the post 244. FIG. 11 provides a cross-sectional view of the spring 234 engaging the post 244 and pocket 245. FIG. 12 provides a zoomed-in view of the post 244 and pocket 245. An end of the compression spring 238 is places around the spring post 244 within the pocket 245 during the assembly process. Post 244 and pocket 245 prevent the end of the spring 238 from moving around and springing out of position. In particular, in an embodiment, post 244 fits form-fittingly inside the inner diameter of the compression spring 238, while the compression spring fits form-fittingly inside the pocket 245.

In an embodiment, post 244 includes a lower surface 248 that projects substantially longitudinally and an upper surface 249 that is slanted away from the inner wall of the housing 204. The lower surface 248 of the post helps retain the spring 238 in place along its longitudinal axis and blocks the spring 238 from springing upward, while the upper surface 249 provides for easier assembly of the spring 238 over the post 244, i.e., by sliding the spring 238 over the post 244.

In addition, in an embodiment, sliding member 234 is also provided with a pocket 246. The other end of the spring 238 is received inside the pocket 246 of the sliding member 234. The pocket 246 also prevents the spring 238 from moving around and springing out of position.

The combination of the sliding member pocket 246, post 244, and post pocket 245 decrease the degree of freedom of compression spring 238 during the assembly process. Constraining the motion of compression spring 238 during the assembly process makes the control module 200 assembly easy and decreases the time required for the assembly.

The example embodiments of the present invention being thus described, it will be obvious that the same may be varied in many ways. Such variations are not to be regarded as departure from the spirit and scope of the example embodiments of the present invention, and all such modifications as would be obvious to one skilled in the art are intended to be included within the scope of the following claims.

The invention claimed is:

1. An electronic switch and control module for a power tool having an electric motor, comprising:
    a module housing including a bottom surface, side walls, and an open face;
    a printed circuit board (PCB) received from the open face of the module housing and securely disposed within the module housing at a distance from the bottom surface of the module housing;
    a plurality of power switches mounted on a top surface of the PCB, the power switches being electrically configured to switchably connect a supply of electric power from a power source to the electric motor;
    a plurality of heat sinks discretely arranged and each mounted over a respective one of the plurality of power switches and secured to the top surface of the PCB to transfer heat away from the power switch through the open face of the module housing;
    an input unit having a plurality of conductive tracks disposed on the PCB and an electro-mechanical element engaging the plurality of conductive tracks, the input unit generating a signal for controlling a switching operation of the plurality of power switches; and
    a controller mounted on the PCB coupled to the plurality of power switches and the input unit, the controller being configured to control the switching operation of the power switches based on the signal from the input unit.

2. The electronic switch and control module of claim 1, wherein the conductive tracks are disposed on the top surface of the PCB.

3. The electronic switch and control module of claim 1, wherein the controller is mounted on a lower surface of the PCB facing the bottom surface of the module housing, the controller being electronically connected to the power switches via a plurality of vias.

4. The electronic switch and control module of claim 1, wherein the module housing includes a plurality of retention features for securely holding the PCB at a distance from the bottom surface of the module housing.

5. The electronic switch and control module of claim 1, wherein each heat sink includes a main plate disposed directly above the respective power switch at close proximity thereto, and at least one leg mounted on the PCB and electronically coupled to a drain of the respective power switch.

6. The electronic switch and control module of claim 1, wherein the plurality of power switches comprise six Field Effect Transistors (FETs) configured as a three-phase bridge rectifier.

7. The electronic switch and control module of claim 1, wherein further comprising a potting compound formed around the PCB within the housing but leaves a top surface of the heat sink exposed through the open face of the module housing.

8. The electronic switch and control module of claim 7, wherein the potting compound leaves exposed a main plate of the heat sink with a surface area of approximately between 20 to 30 mm$^2$.

9. The electronic switch and control module of claim 1, further comprising an encapsulation member that substantially covers the input unit and includes a chamber to house the electro-mechanical element in engagement with the conductive tracks.

10. The electronic switch and control module of claim 9, wherein the encapsulation member mates with at least one of the side walls of the module housing and includes at least one of wire retention or wire guide features arranged to retain or guide wires coupled to the PCB.

11. The electronic switch and control module of claim 1, further including a cover configured to mate with at least one of the side walls of the module housing to partially cover a portion of the PCB not including an area of the PCB where the plurality of power switches and plurality of heat sinks are mounted.

12. The electronic switch and control module of claim 11, wherein the cover includes at least one of wire retention or wire guide features arranged to retain or guide wires coupled to the PCB.

13. An electric power tool comprising:
    an electric motor; and
    an electronic switch and control module according to claim 1.

14. The power tool of claim 13, wherein the electric motor is a three-phase brushless DC motor and the power switches include six Field Effect Transistors connected as a three-phase bridge rectifier.

15. The power tool of claim 13, wherein the electric motor is rotatably coupled to a fan inside a motor housing, and the electric power module is disposed in a tool handle in fluid communication with the motor such that an airflow is generated by the fan through the handle to transfer heat away from the power switches within the open compartment.

* * * * *